(12) United States Patent
Li et al.

(10) Patent No.: US 10,468,551 B2
(45) Date of Patent: Nov. 5, 2019

(54) LIGHT-EMITTER-BASED DEVICES WITH LATTICE-MISMATCHED SEMICONDUCTOR STRUCTURES

(71) Applicant: Taiwan Semiconductor Manufacturing Company, Ltd., Hsin-Chu (TW)

(72) Inventors: Jizhong Li, Bordentown, NJ (US); Anthony J. Lochtefeld, Ipswich, MA (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 140 days.

(21) Appl. No.: 13/903,735

(22) Filed: May 28, 2013

(65) Prior Publication Data

US 2013/0252361 A1 Sep. 26, 2013

Related U.S. Application Data

(62) Division of application No. 11/875,381, filed on Oct. 19, 2007, now Pat. No. 8,502,263.

(Continued)

(51) Int. Cl.
*H01L 33/24* (2010.01)
*H01S 5/24* (2006.01)
(Continued)

(52) U.S. Cl.
CPC .......... *H01L 33/16* (2013.01); *H01L 21/0262* (2013.01); *H01L 21/02381* (2013.01); *H01L 21/02524* (2013.01); *H01L 21/02538* (2013.01); *H01L 21/02546* (2013.01); *H01L 21/02639* (2013.01); *H01L 21/02647* (2013.01); *H01L 33/007* (2013.01); *H01L 33/0066* (2013.01);
(Continued)

(58) Field of Classification Search
CPC ......... H01L 33/08; H01L 33/12; H01L 33/20; H01L 33/24; H01L 21/02639–02642; H01L 21/02647; H01L 33/0066–007; H01L 33/0087; H01S 5/223–2238; H01S 5/227–2277; H01S 5/0218; H01S 5/24; H01S 5/2237; H01S 5/2077; H01S 5/3095
USPC ........................................................ 438/396
See application file for complete search history.

(56) References Cited

U.S. PATENT DOCUMENTS 4,307,510 A   12/1981   Sawyer et al.
4,322,253 A   3/1982   Pankove et al.
(Continued)

FOREIGN PATENT DOCUMENTS

CN   2550906   5/2003
DE   10017137   10/2000
(Continued)

OTHER PUBLICATIONS

Epitaxial Necking in GaAs grown on Pre-Patterned Si Substrates E.A. Fitzgerald et al. JEM vol. 20, No. 10, 1991.*

(Continued)

*Primary Examiner* — Yu Chen
(74) *Attorney, Agent, or Firm* — Slater Matsil, LLP

(57) ABSTRACT

Some aspects for the invention include a method and a structure including a light-emitting device disposed over a second crystalline semiconductor material formed over a semiconductor substrate comprising a first crystalline material.

20 Claims, 10 Drawing Sheets

Related U.S. Application Data

(60) Provisional application No. 60/852,781, filed on Oct. 19, 2006.

(51) Int. Cl.

| | | |
|---|---|---|
| *H01L 33/16* | (2010.01) | |
| *H01S 5/223* | (2006.01) | |
| *H01L 33/20* | (2010.01) | |
| *H01L 33/06* | (2010.01) | |
| *H01L 33/00* | (2010.01) | |
| *H01L 21/02* | (2006.01) | |
| *H01L 33/12* | (2010.01) | |
| H01S 5/02 | (2006.01) | |
| H01S 5/227 | (2006.01) | |
| H01S 5/32 | (2006.01) | |
| H01L 33/08 | (2010.01) | |

(52) U.S. Cl.
CPC ...... *H01L 33/0079* (2013.01); *H01L 33/0087* (2013.01); *H01L 33/06* (2013.01); *H01L 33/12* (2013.01); *H01L 33/20* (2013.01); *H01S 5/223* (2013.01); *H01S 5/2237* (2013.01); *H01S 5/24* (2013.01); *H01L 21/02573* (2013.01); *H01L 33/08* (2013.01); *H01L 33/24* (2013.01); *H01S 5/021* (2013.01); *H01S 5/0207* (2013.01); *H01S 5/0218* (2013.01); *H01S 5/227* (2013.01); *H01S 5/2234* (2013.01); *H01S 5/3202* (2013.01)

(56) References Cited

U.S. PATENT DOCUMENTS

| | | | |
|---|---|---|---|
| 4,370,510 A | | 1/1983 | Stirn |
| 4,482,422 A | * | 11/1984 | McGinn .................. C30B 25/18 117/101 |
| 4,545,109 A | | 10/1985 | Reichert |
| 4,551,394 A | | 11/1985 | Betsch et al. |
| 4,557,794 A | * | 12/1985 | McGinn .................. C30B 25/18 117/101 |
| 4,651,179 A | | 3/1987 | Reichert |
| 4,727,047 A | | 2/1988 | Bozler et al. |
| 4,774,205 A | | 9/1988 | Choi et al. |
| 4,789,643 A | | 12/1988 | Kajikawa |
| 4,826,784 A | | 5/1989 | Salerno et al. |
| 4,860,081 A | | 8/1989 | Cogan |
| 4,876,210 A | | 10/1989 | Barnett et al. |
| 4,948,456 A | | 8/1990 | Schubert |
| 4,963,508 A | | 10/1990 | Umeno et al. |
| 5,032,893 A | | 7/1991 | Fitzgerald, Jr. et al. |
| 5,034,337 A | | 7/1991 | Mosher et al. |
| 5,061,644 A | | 10/1991 | Yue et al. |
| 5,079,616 A | | 1/1992 | Yacobi et al. |
| 5,091,333 A | | 2/1992 | Fan et al. |
| 5,091,767 A | | 2/1992 | Bean et al. |
| 5,093,699 A | | 3/1992 | Weichold et al. |
| 5,098,850 A | | 3/1992 | Nishida et al. |
| 5,105,247 A | | 4/1992 | Cavanaugh |
| 5,108,947 A | | 4/1992 | Demeester et al. |
| 5,156,995 A | | 10/1992 | Fitzgerald, Jr. et al. |
| 5,159,413 A | | 10/1992 | Calviello et al. |
| 5,164,359 A | | 11/1992 | Calviello et al. |
| 5,166,767 A | | 11/1992 | Kapoor et al. |
| 5,170,404 A | * | 12/1992 | Ohtoshi .................. B82Y 20/00 372/45.01 |
| 5,223,043 A | | 6/1993 | Olson et al. |
| 5,236,546 A | | 8/1993 | Mizutani |
| 5,238,869 A | | 8/1993 | Shichijo et al. |
| 5,256,594 A | | 10/1993 | Wu et al. |
| 5,269,852 A | | 12/1993 | Nishida |
| 5,269,876 A | | 12/1993 | Mizutani |
| 5,272,105 A | | 12/1993 | Yacobi et al. |
| 5,281,283 A | | 1/1994 | Tokunaga et al. |
| 5,285,086 A | | 2/1994 | Fitzgerald, Jr. |
| 5,295,150 A | | 3/1994 | Vangieson et al. |
| 5,356,831 A | | 10/1994 | Calviello et al. |
| 5,403,751 A | | 4/1995 | Nishida et al. |
| 5,405,453 A | | 4/1995 | Ho et al. |
| 5,406,574 A | * | 4/1995 | Rennie et al. ............. 372/45.01 |
| 5,407,491 A | | 4/1995 | Freundlich et al. |
| 5,410,167 A | | 4/1995 | Saito |
| 5,417,180 A | | 5/1995 | Nakamura |
| 5,427,976 A | | 6/1995 | Koh et al. |
| 5,432,120 A | | 7/1995 | Meister et al. |
| 5,438,018 A | | 8/1995 | Mori et al. |
| 5,461,243 A | | 10/1995 | Ek et al. |
| 5,518,953 A | | 5/1996 | Takasu |
| 5,528,209 A | | 6/1996 | MacDonald et al. |
| 5,545,586 A | | 8/1996 | Koh |
| 5,548,129 A | | 8/1996 | Kubena |
| 5,589,696 A | | 12/1996 | Baba |
| 5,621,227 A | | 4/1997 | Joshi |
| 5,622,891 A | | 4/1997 | Saito |
| 5,640,022 A | | 6/1997 | Inai |
| 5,710,436 A | | 1/1998 | Tanamoto et al. |
| 5,717,709 A | | 2/1998 | Sasaki et al. |
| 5,792,679 A | | 8/1998 | Nakato |
| 5,825,049 A | | 10/1998 | Simmons et al. |
| 5,825,240 A | | 10/1998 | Geis et al. |
| 5,849,077 A | | 12/1998 | Kenney |
| 5,853,497 A | | 12/1998 | Lillington et al. |
| 5,869,845 A | | 2/1999 | Vander Wagt et al. |
| 5,883,549 A | | 3/1999 | De Los Santos |
| 5,886,385 A | | 3/1999 | Arisumi et al. |
| 5,903,170 A | | 5/1999 | Kulkarni et al. |
| 5,953,361 A | | 9/1999 | Borchert et al. |
| 5,959,308 A | | 9/1999 | Shichijo et al. |
| 5,966,620 A | | 10/1999 | Sakaguchi et al. |
| 5,998,781 A | | 12/1999 | Vawter et al. |
| 6,011,271 A | | 1/2000 | Sakuma et al. |
| 6,015,979 A | | 1/2000 | Sugiura et al. |
| 6,049,098 A | | 4/2000 | Sato |
| 6,083,598 A | | 7/2000 | Ohkubo et al. |
| 6,100,104 A | * | 8/2000 | Haerle .................. H01L 33/007 438/113 |
| 6,100,106 A | | 8/2000 | Yamaguchi et al. |
| 6,110,277 A | * | 8/2000 | Braun .................. H01L 33/007 117/101 |
| 6,110,813 A | | 8/2000 | Ota et al. |
| 6,111,288 A | | 8/2000 | Watanabe et al. |
| 6,121,121 A | * | 9/2000 | Koide .................. H01L 21/0237 257/E21.112 |
| 6,121,542 A | | 9/2000 | Shiotsuka et al. |
| 6,150,242 A | | 11/2000 | Van de Wagt et al. |
| 6,153,010 A | | 11/2000 | Kiyoku et al. |
| 6,191,432 B1 | | 2/2001 | Sugiyama et al. |
| 6,225,650 B1 | | 5/2001 | Tadatomo et al. |
| 6,228,691 B1 | | 5/2001 | Doyle |
| 6,229,153 B1 | | 5/2001 | Botez et al. |
| 6,235,547 B1 | | 5/2001 | Sakuma et al. |
| 6,252,261 B1 | | 6/2001 | Usui et al. |
| 6,252,287 B1 | | 6/2001 | Kurtz et al. |
| 6,271,551 B1 | | 8/2001 | Schmitz et al. |
| 6,274,889 B1 | | 8/2001 | Ota et al. |
| 6,300,650 B1 | | 10/2001 | Sato |
| 6,320,209 B1 | * | 11/2001 | Hata .................. B82Y 20/00 257/190 |
| 6,320,220 B1 | | 11/2001 | Watanabe et al. |
| 6,325,850 B1 | | 12/2001 | Beaumont et al. |
| 6,339,232 B1 | | 1/2002 | Takagi |
| 6,342,404 B1 | * | 1/2002 | Shibata et al. .................. 438/46 |
| 6,348,096 B1 | | 2/2002 | Sunakawa et al. |
| 6,352,942 B1 | | 3/2002 | Luan et al. |
| 6,362,071 B1 | | 3/2002 | Nguyen et al. |
| 6,380,051 B1 | | 4/2002 | Yuasa et al. |
| 6,380,590 B1 | | 4/2002 | Yu |
| 6,403,451 B1 | | 6/2002 | Linthicum et al. |
| 6,407,425 B1 | | 6/2002 | Babcock et al. |
| 6,456,214 B1 | | 9/2002 | van de Wagt |
| 6,458,614 B1 | | 10/2002 | Nanishi et al. |
| 6,475,869 B1 | | 11/2002 | Yu |
| 6,492,216 B1 | | 12/2002 | Yeo et al. |

(56) References Cited

U.S. PATENT DOCUMENTS

| | | |
|---|---|---|
| 6,500,257 B1 | 12/2002 | Wang et al. |
| 6,503,610 B2 | 1/2003 | Hiramatsu et al. |
| 6,512,252 B1 | 1/2003 | Takagi et al. |
| 6,521,514 B1 | 2/2003 | Gehrke et al. |
| 6,552,259 B1 | 4/2003 | Hosomi et al. |
| 6,566,284 B2 | 5/2003 | Thomas, III et al. |
| 6,576,532 B1 | 6/2003 | Jones et al. |
| 6,579,463 B1 | 6/2003 | Winningham et al. |
| 6,603,172 B1 | 8/2003 | Segawa et al. |
| 6,606,335 B1 | 8/2003 | Kuramata et al. |
| 6,617,643 B1 | 9/2003 | Goodwin-Johansson |
| 6,635,110 B1 | 10/2003 | Luan et al. |
| 6,645,295 B1 | 11/2003 | Koike et al. |
| 6,645,797 B1 | 11/2003 | Buynoski et al. |
| 6,686,245 B1 | 2/2004 | Mathew et al. |
| 6,703,253 B2 | 3/2004 | Koide |
| 6,709,982 B1 | 3/2004 | Buynoski et al. |
| 6,710,368 B2 | 3/2004 | Fisher et al. |
| 6,720,196 B2 | 4/2004 | Kunisato et al. |
| 6,727,523 B2 | 4/2004 | Morita |
| 6,753,555 B2 | 6/2004 | Takagi et al. |
| 6,756,611 B2 | 6/2004 | Kiyoku et al. |
| 6,762,483 B1 | 7/2004 | Krivokapic et al. |
| 6,767,793 B2 | 7/2004 | Clark et al. |
| 6,784,074 B2 | 8/2004 | Shchukin et al. |
| 6,787,864 B2 | 9/2004 | Paton et al. |
| 6,794,718 B2 | 9/2004 | Nowak et al. |
| 6,800,910 B2 | 10/2004 | Lin et al. |
| 6,803,598 B1 | 10/2004 | Berger et al. |
| 6,809,351 B2 | 10/2004 | Kuramoto et al. |
| 6,812,053 B1 | 11/2004 | Kong et al. |
| 6,812,495 B2 | 11/2004 | Wada et al. |
| 6,815,241 B2 | 11/2004 | Wang |
| 6,815,738 B2 | 11/2004 | Rim |
| 6,825,534 B2 | 11/2004 | Chen et al. |
| 6,831,350 B1 | 12/2004 | Liu et al. |
| 6,835,246 B2 | 12/2004 | Zaidi |
| 6,835,618 B1 | 12/2004 | Dakshina-Murthy et al. |
| 6,838,322 B2 | 1/2005 | Pham et al. |
| 6,841,410 B2 | 1/2005 | Sasaoka |
| 6,841,808 B2 | 1/2005 | Shibata et al. |
| 6,849,077 B2 | 2/2005 | Ricci |
| 6,849,487 B2 | 2/2005 | Taylor, Jr. et al. |
| 6,849,884 B2 | 2/2005 | Clark et al. |
| 6,855,583 B1 | 2/2005 | Krivokapic et al. |
| 6,855,982 B1 | 2/2005 | Xiang et al. |
| 6,855,990 B2 | 2/2005 | Yeo et al. |
| 6,867,433 B2 | 3/2005 | Yeo et al. |
| 6,873,009 B2 | 3/2005 | Hisamoto et al. |
| 6,882,051 B2 | 4/2005 | Majumdar et al. |
| 6,887,773 B2 | 5/2005 | Gunn, III et al. |
| 6,888,181 B1 | 5/2005 | Liao et al. |
| 6,900,070 B2 | 5/2005 | Craven et al. |
| 6,900,502 B2 | 5/2005 | Ge et al. |
| 6,902,965 B2 | 6/2005 | Ge et al. |
| 6,902,991 B2 | 6/2005 | Xiang et al. |
| 6,909,186 B2 | 6/2005 | Chu |
| 6,917,068 B1 | 7/2005 | Krivokapic |
| 6,919,258 B2 | 7/2005 | Grant et al. |
| 6,920,159 B2 | 7/2005 | Sidorin et al. |
| 6,921,673 B2 | 7/2005 | Kobayashi et al. |
| 6,921,963 B2 | 7/2005 | Krivokapic et al. |
| 6,921,982 B2 | 7/2005 | Joshi et al. |
| 6,936,875 B2 | 8/2005 | Sugii et al. |
| 6,940,103 B2 | 9/2005 | Kiyoku et al. |
| 6,943,407 B2 | 9/2005 | Ouyang et al. |
| 6,946,683 B2 | 9/2005 | Sano et al. |
| 6,949,769 B2 | 9/2005 | Hu et al. |
| 6,951,819 B2 | 10/2005 | Iles et al. |
| 6,955,969 B2 | 10/2005 | Djomehri et al. |
| 6,955,977 B2 | 10/2005 | Kong et al. |
| 6,958,254 B2 | 10/2005 | Seifert |
| 6,960,781 B2 | 11/2005 | Currie et al. |
| 6,974,733 B2 | 12/2005 | Boyanov et al. |
| 6,977,194 B2 | 12/2005 | Belyansky et al. |
| 6,982,204 B2 | 1/2006 | Saxler et al. |
| 6,982,435 B2 | 1/2006 | Shibata et al. |
| 6,984,571 B1 | 1/2006 | Enquist |
| 6,991,998 B2 | 1/2006 | Bedell et al. |
| 6,994,751 B2 | 2/2006 | Hata et al. |
| 6,995,430 B2 | 2/2006 | Langdo et al. |
| 6,995,456 B2 | 2/2006 | Nowak |
| 6,996,147 B2 | 2/2006 | Majumdar et al. |
| 6,998,684 B2 | 2/2006 | Anderson et al. |
| 7,001,804 B2 | 2/2006 | Dietz et al. |
| 7,002,175 B1 | 2/2006 | Singh et al. |
| 7,012,298 B1 | 3/2006 | Krivokapic |
| 7,012,314 B2 | 3/2006 | Bude et al. |
| 7,015,497 B1 | 3/2006 | Berger |
| 7,015,517 B2 | 3/2006 | Grant et al. |
| 7,033,436 B2 | 4/2006 | Biwa et al. |
| 7,033,936 B1 | 4/2006 | Green |
| 7,041,178 B2 | 5/2006 | Tong et al. |
| 7,045,401 B2 | 5/2006 | Lee et al. |
| 7,049,627 B2 | 5/2006 | Vineis et al. |
| 7,061,065 B2 | 6/2006 | Horng et al. |
| 7,074,623 B2 | 7/2006 | Lochtefeld et al. |
| 7,078,299 B2 | 7/2006 | Maszara et al. |
| 7,078,731 B2 | 7/2006 | D'Evelyn et al. |
| 7,084,051 B2 | 8/2006 | Ueda |
| 7,084,441 B2 | 8/2006 | Saxler |
| 7,087,965 B2 | 8/2006 | Chan et al. |
| 7,088,143 B2 | 8/2006 | Ding et al. |
| 7,091,561 B2 | 8/2006 | Matsushita et al. |
| 7,095,043 B2 | 8/2006 | Oda et al. |
| 7,098,508 B2 | 8/2006 | Ieong et al. |
| 7,101,444 B2 | 9/2006 | Shchukin et al. |
| 7,109,516 B2 | 9/2006 | Langdo et al. |
| 7,118,987 B2 | 10/2006 | Fu et al. |
| 7,119,402 B2 | 10/2006 | Kinoshita et al. |
| 7,122,733 B2 | 10/2006 | Narayanan et al. |
| 7,125,785 B2 | 10/2006 | Cohen et al. |
| 7,128,846 B2 | 10/2006 | Nishijima et al. |
| 7,132,691 B1 | 11/2006 | Tanabe et al. |
| 7,138,292 B2 | 11/2006 | Mirabedini et al. |
| 7,138,302 B2 | 11/2006 | Xiang et al. |
| 7,145,167 B1 | 12/2006 | Chu |
| 7,154,118 B2 | 12/2006 | Lindert et al. |
| 7,160,753 B2 | 1/2007 | Williams, Jr. |
| 7,164,183 B2 | 1/2007 | Sakaguchi et al. |
| 7,176,522 B2 | 2/2007 | Cheng et al. |
| 7,179,727 B2 | 2/2007 | Capewell et al. |
| 7,180,134 B2 | 2/2007 | Yang et al. |
| 7,195,993 B2 | 3/2007 | Zheleva et al. |
| 7,198,995 B2 | 4/2007 | Chidambarrao et al. |
| 7,205,586 B2 | 4/2007 | Takagi et al. |
| 7,205,604 B2 | 4/2007 | Ouyang et al. |
| 7,211,864 B2 | 5/2007 | Seliskar |
| 7,217,882 B2 | 5/2007 | Walukiewicz et al. |
| 7,224,033 B2 | 5/2007 | Zhu et al. |
| 7,244,958 B2 | 7/2007 | Shang et al. |
| 7,247,534 B2 | 7/2007 | Chidambarrao et al. |
| 7,247,912 B2 | 7/2007 | Zhu et al. |
| 7,250,359 B2 | 7/2007 | Fitzgerald |
| 7,262,117 B1 | 8/2007 | Gunn, III et al. |
| 7,268,058 B2 | 9/2007 | Chau et al. |
| 7,297,569 B2 | 11/2007 | Bude et al. |
| 7,344,942 B2 | 3/2008 | Korber |
| 7,361,576 B2 | 4/2008 | Imer et al. |
| 7,372,066 B2 | 5/2008 | Sato et al. |
| 7,420,201 B2 | 9/2008 | Langdo et al. |
| 7,449,379 B2 | 11/2008 | Ochimizu et al. |
| 7,582,498 B2 | 9/2009 | D'Evelyn et al. |
| 7,626,246 B2 | 12/2009 | Lochtefeld et al. |
| 7,638,842 B2 | 12/2009 | Currie et al. |
| 7,655,960 B2 | 2/2010 | Nakahata et al. |
| 7,777,250 B2 | 8/2010 | Lochtefeld |
| 7,799,592 B2 | 9/2010 | Lochtefeld |
| 7,825,328 B2 | 11/2010 | Li |
| 7,875,958 B2 | 1/2011 | Cheng et al. |
| 8,034,697 B2 | 10/2011 | Fiorenza et al. |
| 2001/0006249 A1 | 7/2001 | Fitzgerald |
| 2001/0023702 A1* | 9/2001 | Nakagawa ............ H01L 31/042 136/244 |

(56) References Cited

U.S. PATENT DOCUMENTS

| | | |
|---|---|---|
| 2001/0045604 A1 | 11/2001 | Oda et al. |
| 2002/0011612 A1 | 1/2002 | Hieda |
| 2002/0017642 A1 | 2/2002 | Mizushima et al. |
| 2002/0022290 A1 | 2/2002 | Kong et al. |
| 2002/0030246 A1 | 3/2002 | Eisenbeiser et al. |
| 2002/0036290 A1 | 3/2002 | Inaba et al. |
| 2002/0046693 A1* | 4/2002 | Kiyoku .................. B82Y 20/00 117/8 |
| 2002/0047155 A1 | 4/2002 | Babcock et al. |
| 2002/0066403 A1 | 6/2002 | Sunakawa et al. |
| 2002/0070383 A1* | 6/2002 | Shibata ............. H01L 21/02381 257/76 |
| 2002/0079498 A1* | 6/2002 | Koide .................... H01L 33/08 257/79 |
| 2002/0084000 A1 | 7/2002 | Fitzgerald |
| 2002/0117677 A1* | 8/2002 | Okuyama ......... H01L 21/02381 257/94 |
| 2002/0127427 A1 | 9/2002 | Young et al. |
| 2002/0168802 A1 | 11/2002 | Hsu et al. |
| 2002/0168844 A1* | 11/2002 | Kuramoto ............... C30B 25/02 438/604 |
| 2002/0179005 A1 | 12/2002 | Koike et al. |
| 2003/0030117 A1 | 2/2003 | Iwasaki et al. |
| 2003/0045017 A1 | 3/2003 | Hiramatsu et al. |
| 2003/0057486 A1 | 3/2003 | Gambino et al. |
| 2003/0064535 A1 | 4/2003 | Kub et al. |
| 2003/0070707 A1 | 4/2003 | King et al. |
| 2003/0087462 A1 | 5/2003 | Koide et al. |
| 2003/0089899 A1 | 5/2003 | Lieber et al. |
| 2003/0104658 A1* | 6/2003 | Furukawa ......... H01L 21/76262 438/151 |
| 2003/0155586 A1* | 8/2003 | Koide et al. .................. 257/200 |
| 2003/0168002 A1 | 9/2003 | Zaidi |
| 2003/0178677 A1 | 9/2003 | Clark et al. |
| 2003/0178681 A1 | 9/2003 | Clark et al. |
| 2003/0178702 A1* | 9/2003 | Sawaki ................... C30B 25/02 257/622 |
| 2003/0183827 A1 | 10/2003 | Kawaguchi et al. |
| 2003/0203531 A1 | 10/2003 | Shchukin et al. |
| 2003/0207518 A1 | 11/2003 | Kong et al. |
| 2003/0227036 A1 | 12/2003 | Sugiyama et al. |
| 2003/0230759 A1 | 12/2003 | Thomas, III et al. |
| 2004/0005740 A1 | 1/2004 | Lochtefeld et al. |
| 2004/0012037 A1 | 1/2004 | Venkatesan et al. |
| 2004/0016921 A1 | 1/2004 | Botez et al. |
| 2004/0031979 A1 | 2/2004 | Lochtefeld et al. |
| 2004/0041932 A1 | 3/2004 | Chao et al. |
| 2004/0043584 A1 | 3/2004 | Thomas et al. |
| 2004/0072410 A1 | 4/2004 | Motoki et al. |
| 2004/0075105 A1 | 4/2004 | Leitz et al. |
| 2004/0075464 A1 | 4/2004 | Samuelson et al. |
| 2004/0082150 A1 | 4/2004 | Kong et al. |
| 2004/0087051 A1 | 5/2004 | Furuya et al. |
| 2004/0092060 A1 | 5/2004 | Gambino et al. |
| 2004/0118451 A1 | 6/2004 | Walukiewicz et al. |
| 2004/0121507 A1 | 6/2004 | Bude et al. |
| 2004/0123796 A1 | 7/2004 | Nagai et al. |
| 2004/0142503 A1 | 7/2004 | Lee et al. |
| 2004/0150001 A1 | 8/2004 | Shchukin et al. |
| 2004/0155249 A1* | 8/2004 | Narui .................... B82Y 20/00 257/79 |
| 2004/0173812 A1 | 9/2004 | Currie et al. |
| 2004/0183078 A1 | 9/2004 | Wang |
| 2004/0185665 A1 | 9/2004 | Kishimoto et al. |
| 2004/0188791 A1 | 9/2004 | Horng et al. |
| 2004/0195624 A1 | 10/2004 | Liu et al. |
| 2004/0227187 A1 | 11/2004 | Cheng et al. |
| 2004/0247218 A1 | 12/2004 | Ironside et al. |
| 2004/0256613 A1 | 12/2004 | Oda et al. |
| 2004/0256647 A1 | 12/2004 | Lee et al. |
| 2004/0262617 A1 | 12/2004 | Hahm et al. |
| 2005/0001216 A1 | 1/2005 | Adkisson et al. |
| 2005/0003572 A1 | 1/2005 | Hahn et al. |
| 2005/0009304 A1 | 1/2005 | Zheleva et al. |
| 2005/0017351 A1 | 1/2005 | Ravi |
| 2005/0035410 A1 | 2/2005 | Yeo et al. |
| 2005/0040444 A1 | 2/2005 | Cohen |
| 2005/0045983 A1 | 3/2005 | Noda et al. |
| 2005/0054164 A1 | 3/2005 | Xiang |
| 2005/0054180 A1 | 3/2005 | Han et al. |
| 2005/0056827 A1 | 3/2005 | Li et al. |
| 2005/0056892 A1 | 3/2005 | Seliskar |
| 2005/0072995 A1 | 4/2005 | Anthony |
| 2005/0073028 A1 | 4/2005 | Grant et al. |
| 2005/0093021 A1 | 5/2005 | Ouyang et al. |
| 2005/0093154 A1 | 5/2005 | Kottantharayil et al. |
| 2005/0104152 A1 | 5/2005 | Snyder et al. |
| 2005/0104156 A1 | 5/2005 | Wasshuber |
| 2005/0118793 A1 | 6/2005 | Snyder et al. |
| 2005/0118825 A1 | 6/2005 | Nishijima et al. |
| 2005/0121688 A1 | 6/2005 | Nagai et al. |
| 2005/0127451 A1 | 6/2005 | Tsuchiya et al. |
| 2005/0136626 A1 | 6/2005 | Morse |
| 2005/0139860 A1 | 6/2005 | Snyder et al. |
| 2005/0145941 A1 | 7/2005 | Bedell et al. |
| 2005/0145954 A1 | 7/2005 | Zhu et al. |
| 2005/0148161 A1 | 7/2005 | Chen et al. |
| 2005/0156169 A1 | 7/2005 | Chu |
| 2005/0156202 A1 | 7/2005 | Rhee et al. |
| 2005/0161711 A1 | 7/2005 | Chu |
| 2005/0164475 A1 | 7/2005 | Peckerar et al. |
| 2005/0181549 A1 | 8/2005 | Barr et al. |
| 2005/0184302 A1 | 8/2005 | Kobayashi et al. |
| 2005/0205859 A1 | 9/2005 | Currie et al. |
| 2005/0205932 A1 | 9/2005 | Cohen |
| 2005/0211291 A1 | 9/2005 | Bianchi |
| 2005/0212051 A1 | 9/2005 | Jozwiak et al. |
| 2005/0217565 A1 | 10/2005 | Lahreche et al. |
| 2005/0245095 A1 | 11/2005 | Haskell et al. |
| 2005/0263751 A1 | 12/2005 | Hall et al. |
| 2005/0274409 A1 | 12/2005 | Fetzer et al. |
| 2005/0277260 A1* | 12/2005 | Cohen ..................... H01L 21/84 438/387 |
| 2005/0280103 A1 | 12/2005 | Langdo et al. |
| 2006/0009012 A1 | 1/2006 | Leitz et al. |
| 2006/0019462 A1 | 1/2006 | Cheng et al. |
| 2006/0049409 A1 | 3/2006 | Rafferty et al. |
| 2006/0057825 A1* | 3/2006 | Bude et al. .................... 438/481 |
| 2006/0073681 A1 | 4/2006 | Han |
| 2006/0105533 A1 | 5/2006 | Chong et al. |
| 2006/0112986 A1 | 6/2006 | Atwater, Jr. et al. |
| 2006/0113603 A1 | 6/2006 | Currie |
| 2006/0128124 A1 | 6/2006 | Haskell et al. |
| 2006/0131606 A1 | 6/2006 | Cheng |
| 2006/0144435 A1 | 7/2006 | Wanlass |
| 2006/0145264 A1 | 7/2006 | Chidambarrao et al. |
| 2006/0160291 A1 | 7/2006 | Lee et al. |
| 2006/0162768 A1 | 7/2006 | Wanlass et al. |
| 2006/0166437 A1 | 7/2006 | Korber |
| 2006/0169987 A1 | 8/2006 | Miura et al. |
| 2006/0175601 A1 | 8/2006 | Lieber et al. |
| 2006/0186510 A1 | 8/2006 | Lochtefeld et al. |
| 2006/0189056 A1 | 8/2006 | Ko et al. |
| 2006/0197123 A1 | 9/2006 | Lochtefeld et al. |
| 2006/0197124 A1 | 9/2006 | Lochtefeld et al. |
| 2006/0197126 A1 | 9/2006 | Lochtefeld et al. |
| 2006/0202276 A1 | 9/2006 | Kato |
| 2006/0205197 A1 | 9/2006 | Yi et al. |
| 2006/0211210 A1 | 9/2006 | Bhat et al. |
| 2006/0244005 A1* | 11/2006 | Chen ............................ 257/122 |
| 2006/0266281 A1 | 11/2006 | Beaumont et al. |
| 2006/0267047 A1 | 11/2006 | Murayama |
| 2006/0292719 A1 | 12/2006 | Lochtefeld et al. |
| 2007/0025670 A1 | 2/2007 | Pan et al. |
| 2007/0029643 A1 | 2/2007 | Johnson et al. |
| 2007/0054465 A1 | 3/2007 | Currie et al. |
| 2007/0054467 A1 | 3/2007 | Currie et al. |
| 2007/0099315 A1 | 5/2007 | Maa et al. |
| 2007/0099329 A1 | 5/2007 | Maa et al. |
| 2007/0102721 A1 | 5/2007 | DenBaars et al. |
| 2007/0105256 A1 | 5/2007 | Fitzgerald |
| 2007/0105274 A1 | 5/2007 | Fitzgerald |
| 2007/0105335 A1 | 5/2007 | Fitzgerald |

(56) References Cited

U.S. PATENT DOCUMENTS

| | | |
|---|---|---|
| 2007/0181977 A1 | 8/2007 | Lochtefeld et al. |
| 2007/0187668 A1 | 8/2007 | Noguchi et al. |
| 2007/0187796 A1 | 8/2007 | Rafferty et al. |
| 2007/0196987 A1 | 8/2007 | Chidambarrao et al. |
| 2007/0248132 A1 | 10/2007 | Kikuchi et al. |
| 2007/0267722 A1 | 11/2007 | Lochtefeld et al. |
| 2008/0001169 A1 | 1/2008 | Lochtefeld |
| 2008/0070355 A1 | 3/2008 | Lochtefeld et al. |
| 2008/0073641 A1 | 3/2008 | Cheng et al. |
| 2008/0073667 A1 | 3/2008 | Lochtefeld |
| 2008/0099785 A1 | 5/2008 | Bai et al. |
| 2008/0154197 A1 | 6/2008 | Derrico et al. |
| 2008/0187018 A1 | 8/2008 | Li |
| 2008/0194078 A1 | 8/2008 | Akiyama et al. |
| 2008/0245400 A1 | 10/2008 | Li |
| 2008/0257409 A1 | 10/2008 | Li et al. |
| 2008/0286957 A1 | 11/2008 | Lee et al. |
| 2009/0039361 A1 | 2/2009 | Li et al. |
| 2009/0042344 A1 | 2/2009 | Ye et al. |
| 2009/0065047 A1 | 3/2009 | Fiorenza et al. |
| 2009/0072284 A1 | 3/2009 | King et al. |
| 2009/0110898 A1 | 4/2009 | Levy et al. |
| 2009/0321882 A1 | 12/2009 | Park |
| 2010/0012976 A1 | 1/2010 | Hydrick et al. |
| 2010/0025683 A1 | 2/2010 | Cheng |
| 2010/0072515 A1 | 3/2010 | Park et al. |
| 2010/0078680 A1 | 4/2010 | Cheng et al. |
| 2010/0176371 A1 | 7/2010 | Lochtefeld |
| 2010/0176375 A1 | 7/2010 | Lochtefeld |
| 2010/0213511 A1 | 8/2010 | Lochtefeld |
| 2010/0216277 A1 | 8/2010 | Fiorenza et al. |
| 2010/0252861 A1 | 10/2010 | Lochtefeld |
| 2010/0308376 A1 | 12/2010 | Takada et al. |
| 2011/0011438 A1 | 1/2011 | Li |
| 2011/0049568 A1 | 3/2011 | Lochtefeld et al. |
| 2011/0086498 A1 | 4/2011 | Cheng et al. |

FOREIGN PATENT DOCUMENTS

| | | |
|---|---|---|
| DE | 10320160 | 8/2004 |
| EP | 0352472 | 6/1989 |
| EP | 0600276 | 6/1994 |
| EP | 0817096 | 1/1998 |
| EP | 1551063 | 7/2005 |
| EP | 1796180 | 6/2007 |
| GB | 2215514 | 9/1989 |
| JP | 2062090 | 3/1990 |
| JP | 7230952 | 8/1995 |
| JP | 10126010 | 5/1998 |
| JP | 10284436 | 10/1998 |
| JP | 10284507 | 10/1998 |
| JP | 11251684 | 9/1999 |
| JP | 11307866 | 11/1999 |
| JP | 2000021789 | 1/2000 |
| JP | 2000216432 | 8/2000 |
| JP | 2000286449 | 10/2000 |
| JP | 2000299532 | 10/2000 |
| JP | 2001007447 | 1/2001 |
| JP | 2001102678 | 4/2001 |
| JP | 3202223 | 8/2001 |
| JP | 2001257351 | 9/2001 |
| JP | 2002118255 | 4/2002 |
| JP | 2002141553 | 5/2002 |
| JP | 2002241192 | 8/2002 |
| JP | 2002293698 | 10/2002 |
| JP | 2003163370 | 6/2003 |
| JP | 3515974 | 4/2004 |
| JP | 2004200375 | 7/2004 |
| JP | 2009177167 | 8/2009 |
| KR | 20030065631 | 8/2003 |
| KR | 20090010284 | 1/2009 |
| TW | 544930 | 8/2003 |
| WO | WO200072383 | 11/2000 |
| WO | WO2001001465 | 1/2001 |
| WO | WO200209187 | 1/2002 |
| WO | WO2002086952 | 10/2002 |
| WO | WO2002088834 | 11/2002 |
| WO | WO2003073517 | 9/2003 |
| WO | WO2004004927 | 1/2004 |
| WO | WO2004023536 | 3/2004 |
| WO | WO2005013375 | 2/2005 |
| WO | WO2005048330 | 5/2005 |
| WO | WO2005098963 | 10/2005 |
| WO | WO2005122267 | 12/2005 |
| WO | WO2006025407 | 3/2006 |
| WO | WO2006125040 | 11/2006 |
| WO | WO2008124154 | 10/2008 |

OTHER PUBLICATIONS

Solid State Electronic Devices Ben G. Streetman et al. Prentice Hall, 5th Ed.*

"Communication pursuant to Article 94(3) EPC," Application No. 06 770 525.1-2203, Applicant: Taiwan Semiconductor Company, Ltd., Feb. 17, 2011, 4 pages.

"Epitaxial Lateral Overgrowth of GaAs on a Si Substrate," 28 Jap. J. App. Physics 3, pp. L337-L339, Mar. 1989.

68 Applied Physics Letters 7, 1999, pp. 774-779 (trans. of relevant portions attached).

Ames, "Intel Says More Efficient Chips are Coming," PC World, availabe at: http://www.pcworld.com/printable/article/id,126044/printable.html (Jun. 12, 2006); 4 pages.

Asano et al., "AlGaInN laser diodes grown on an ELO-GaN substrate vs. on a sapphire substrate," Semiconductor Laser Conference (2000) Conference Digest, IEEE $17^{th}$ International, 2000, pp. 109-110.

Asaoka, et al., "Observation of 1 f $^x$/noise of GaInP/GaAs triple barrier resonant tunneling diodes," AIP Conf. Proc., vol. 780, Issue 1, 2005, pp. 492-495.

Ashby, et al., "Low-dislocation-density GaN from a single growth on a textured substrate," Applied Physics Letters, vol. 77, No. 20, Nov. 13, 2000, pp. 3233-3235.

Ashley, et al., "Heterogeneous InSb Quantum Well Transistors on Silicon for Ultra-High Speed, Low Power Logic Applications," 43 Electronics Letters 14, Jul. 2007, 2 pages.

Bai et al., "Study of the Defect Elimination Mechanisms in Aspect Ratio Trapping Ge Growth," Applied Physics Letters, vol. 90, 2007, 3 pages.

Bakkers et al., "Epitaxial Growth on InP Nanowires on Germanium," Nature Materials, vol. 3, Nov. 2004, pp. 769-773.

Baron et al., "Chemical Vapor Deposition of Ge Nanocrystals on $SiO_2$," Applied Physics Letters, vol. 83, No. 7, Aug. 18, 2003, pp. 1444-1446.

Bean et al., "$Ge_xSi_{1-x}$/Si strained-later Superlattice grown by molecular beam Epitaxy," Journal of Vacuum Science Technology A2 (2), Jun. 1984, pp. 436-440.

Beckett et al., "Towards a reconfigurable nanocomputer platform," ACM International Conference Proceeding Series, vol. 19, 2002, pp. 141-150.

Beltz et al., "A Theoretical Model for Threading Dislocation Reduction During Selective Area Growth," Materials Science and Engineering, A234-236, 1997, pp. 794-797.

Belyaev, et al., "Resonance and current instabilities in AlN/GaN resonant tunneling diodes," 21 Physica E 2-4, 2004, pp. 752-755.

Berg, J., "Electrical Characterization of Silicon Nanogaps," Doktorsavhandlingar vid Chalmers Tekniska Hagskola, 2005, No. 2355, 2 pages.

Bergman et al., "RTD/CMOS Nanoelectronic Circuits: Thin-Film InP-based Resonant Tunneling Diodes Integrated with CMOS circuits," 20 Electron Device Letters 3, 1999, pp. 119-122.

Blakeslee, "The Use of Superlattices to Block the Propagation of Dislocations in Semiconductors," Mat. Res. Soc. Symposium Proceedings 148, 1989, pp. 217-227.

Bogumilowicz et al., "Chemical Vapour Etching of Si, SiGe and Ge with HCL: Applications to the Formation of Thin Relaxed SiGe Buffers and to the Revelation of Threading Dislocations," 20 Semicond. Sci. Tech. 2005, pp. 127-134.

(56) References Cited

OTHER PUBLICATIONS

Borland, "Novel Device structures by selective epitaxial growth (SEG)," Electron Devices Meeting, vol. 33, 1987, pp. 12-15.
Bryskiewicz, "Dislocation filtering in SiGe and InGaAs buffer layers grown by selective lateral overgrowth method," Applied Physics Letters, vol. 66, No. 10, Mar. 6, 1995, pp. 1237-1239.
Burenkov et al., "Corner Effect in Double and Triple Gate FinFETs" European solid-state device research, 33rd Conference on Essderc '03 Sep. 16-18, 2003, Piscataway, NJ, USA, IEEE, vol. 16, pp. 135-38, XP010676716.
Bushroa et al., "Lateral epitaxial overgrowth and reduction in defect density of 3C—SiC on patterned Si substrates," Journal of Crystal Growth, vol. 271, No. 1-2, Oct. 15, 2004, pp. 200-206.
Calado, et al., "Modeling of a resonant tunneling diode optical modulator," University of Algarve, Department of Electronics and Electrical Engineering, 2005, pp. 96-99.
Campo et al., "Comparison of Etching Processes of Silicon and Germanium in SF6-O2 Radio-Frequency Plasma," 13 Journal of Vac. Sci. Tech., B-2, 1995, pp. 235-241.
Cannon et al., "Monolithic Si-based Technology for Optical Receiver Circuits," Proceedings of SPIE, vol. 4999, 2003, pp. 145-155.
Chan et al., "Influence of Metalorganic Sources on the Composition Uniformity of Selectively Grown $Ga_xIn_{1-x}P$," Japan. Journal of Applied Physics, vol. 33, 1994, pp. 4812-4819.
Chang et al. "3-D simulation of strained Si/SiGe heterojunction FinFETs" Semiconductor Device Research Symposium, Dec. 10-12, 2003, pp. 176-177.
Chang et al., "Effect of growth temperature on epitaxial lateral overgrowth of GaAs on Si substrate," Journal of Crystal Growth, vol. 174, No. 1-4, Apr. 1997, pp. 630-634.
Chang et al., "Epitaxial Lateral Overgrowth of Wide Dislocation-Free GaAs on Si Substrates," Electrochemical Society Proceedings, vol. 97-21, May 13, 1998, pp. 196-200.
Chau et al., Opportunities and Challenges of III-V Nanoelectronics for Future High-Speed, Low Power Logic Applications, IEEE CSIC Digest, 2005, pp. 17-20.
Chen et al., "Dislocation reduction in GaN thin films via lateral overgrowth from trenches," Applied Physics Letters, vol. 75, No. 14, Oct. 4, 1999, pp. 2062-2063.
Chengrong, et al., "DBRTD with a high PVCR and a peak current density at room temperature," Chinese Journal of Semiconductors vol. 26, No. 10, Oct. 2005, pp. 1871-1874.
Choi et al., "Monolithic Integration GaAs/AlGaAs LED and Si Driver Circuit," 9 Electron Device Letters 10, Oct. 1988, 3 pages.
Choi et al., "Monolithic Integration of GaAs/AlGaAs Double-Heterostructure LEDs and Si MOSFETs," Electron Device Letters, vol. EDL-7, No. 9, Sep. 1986, 3 pages.
Choi et al., "Monolithic Integration of Si MOSFETs and GaAs MESFETs," Electron Device Letters, vol. EDL-7, No. 4, Apr. 1986, 3 pages.
Choi, et al., "Low-voltage low-power K-band balanced RTD-based MMIC VCO," 2006 IEEE, Department of EECS, Korea Advanced Institute of Science and Technology, 2006, pp. 743-746.
Cloutier et al., "Optical gain and stimulated emission in periodic nanopatterned crystalline silicon," Nature Materials, Nov. 2005, 5 pages.
Currie et al., "Carrier Mobilities and Process Stability of Strained Si n- and p-MOSFETs on SiGe Virtual Substrates," J. Vacuum Science Technology, B, vol. 19, No. 6, 2001, pp. 2268-2279.
Dadgar et al., "MOVPE growth of GaN on Si (111) substrates," Journal of Crystal Growth, vol. 248, Feb. 1, 2003, pp. 556-562.
Datta et al., "Silicon and III-V Nanoelectronics," IEEE International Conference on Indium Phosphide & Related Materials, 2005, pp. 7-8.
Datta et al., "Ultrahigh-Speed 0.5 V Supply Voltage In0.7Ga0.3As Quantum-Well Transistors on Silicon Substrate," 28 Electron Device Letters 8, 2007, pp. 685-687.
Davis et al., "Lateral epitaxial overgrowth of and defect reduction in GaN thin films," Lasers and Electro-Optics Society Annual Meeting (1998) LEOS '98. IEEE, vol. 1, Dec. 1-4, 1998, pp. 360-361.
De Boeck et al., "The fabrication on a novel composite $GaAs/SiO_2$ nucleation layer on silicon for heteroepitaxial overgrowth by molecular beam Epitaxy," Material Science and Engineering, B9, 1991, pp. 137-141.
Donaton et al., "Design and Fabrication of MOSFETs with a Reverse Embedded SiGe (Rev. e-SiGe) Structure," 2006 IEDM, pp. 465-468.
Dong et al., "Selective area growth of InP through narrow openings by MOCVD and its application to inP HBT," Indium Phosphide and Related Materials, International Conference, May 12-16, 2003, pp. 389-392.
Dong, Y., et al, "Selective area growth of InP through narrow openings by MOCVD and its application to InP HBT," 2003 International Conference on Indium Phosphide and Related Materials, May 12-16, 2003, pp. 389-392.
European Patent Office, Extended European Search Report and Search Opinion dated Jan. 26, 2011 in EP Patent Application No. 10003084.0-2203 (9 pages).
European Search Report issued by the European Patent Office dated Dec. 15, 2010 in European Patent Application No. 10002884.4 (10 pages).
Fang et al., "Electrically pumped hybrid AlGaInAs-silicon evanescent laser," 14 Optics Express 20, 2006, pp. 9203-9210.
Feltin et al., "Epitaxial lateral overgrowth of GaN on Si (111)," Journal of Applied Physics, vol. 93, No. 1, Jan. 1, 2003, pp. 182-185.
Feng et al., "Integration of Germanium-on Insulator and Silicon Substrate," 27 Electron Device Letters 11, 2006, pp. 911-913.
Fiorenza et al., "Film Thickness Constraints for Manufacturable Strained Silicon CMOS," 19 Semiconductor Science Technology, 2004, p. L4.
Fischer et al., "Elastic stress relaxation in SiGe epilayers on patterned Si substrates," 75 Journal of Applied Physics 1, 1994, pp. 657-659.
Fischer et al., "State of stress and critical thickness of Strained small-area SiGe layers," Phys. Stat. Sol. (a) vol. 171, 1999, pp. 475-485.
Fitzgerald et al., "Elimination of Dislocations in Heteroepitaxial MBE and RTCVD $Ge_xSi_{1-x}$ Grown on Patterned Si Substrates," Journal of Electronic Materials, vol. 19, No. 9, 1990, pp. 949-955.
Fitzgerald et al., "Epitaxial Necking in GaAs Growth on Pre-patterned Si Substrates," Journal of Electronic Materials, vol. 20, No. 10, 1991, pp. 839-853.
Fitzgerald et al., "Nucleation Mechanisms and the Elimination of Misfit Dislocations at Mismatched Interfaces by Reduction in Growth Areas," Journal of Applied Physics, vol. 65, No. 6, Mar. 15, 1989, pp. 2220-2237.
Fitzgerald et al., "Structure and recombination in InGaAs/GaAs heterostructures," 63 Journal of Applied Physics, vol. 3, 1988, pp. 693-703.
Fitzgerald et al., "Totally relaxed $Ge_xSi_{1-x}$ layers with low threading dislocation densities grown on Si Substrates," vol. 59, Applied Physics Letters 7, 1991, pp. 811-813.
Fitzgerald, "The Effect of Substrate Growth Area on Misfit and Threading Dislocation Densities in Mismatched Heterostructures," Journal of Vacuum Science Technology, vol. 7, No. 4, Jul./Aug. 1989, pp. 782-788.
Gallagher et al., "Development of the magnetic tunnel junction MRAM at IBM: From first junctions to a 16-MB MRAM demonstrator chip," 50 IBM J. Research & Dev. 1, Jan. 2006, pp. 5-23A.
Gallas et al., "Influence of Doping on Facet Formation at the $SiO_2$/Si Interface," Surface Sci. 440, 1999, pp. 41-48.
Geppert, "Quantum transistors: toward nanoelectronics," IEEE Spectrum, Sep. 2000, pp. 46-51.
Gibbon et al., "Selective-area low-pressure MOCVD of GaInAsP and related materials on planar InP substrates," Semicond. Sci. Tech. vol. 8, 1993, pp. 998-1010.
Glew et al., "New DFB grating structure using dopant-induced refractive index step," J. Crystal Growth 261, 2004, pp. 349-354.

(56) References Cited

OTHER PUBLICATIONS

Golka, et al., "Negative differential resistance in dislocation-free GaN/AlGan double-barrier diodes grown on bulk GaN," 88 Applied Physics Letters 17, Apr. 2006, pp. 172106-1-172106-3.

Goodnick, S.M., "Radiation Physics and Reliability Issues in III-V Compound Semiconductor Nanoscale Heterostructure Devices," Final Technical Report, Arizona State Univ. Dept. Electrical & Computer Eng, 80 pages, 1996-1999.

Gould et al., "Magnetic resonant tunneling diodes as voltage-controlled spin selectors," 241 Phys. Stat. Sol. (B), vol. 3, 2004, pp. 700-703.

Groenert et al., "Monolithic integration of room-temperature cw GaAs/AlGaAs lasers on Si substrates via relaxed graded GeSi buffer layers," 93 Journal of Applied Physics, No. 362, Jan. 2003, pp. 362-367.

Gruber, et al., "Semimagnetic Resonant Tunneling Diodes for Electron Spin Manipulation," Nanostructures: Physics & Technology, 8th International Symposium, 2000, pp. 483-486.

Gustafsson et al., "Cathodoluminescence from relaxed $Ge_xSi_{1-x}$ grown by heteroepitaxial lateral overgrowth," Journal of Crystal Growth 141, 1994, pp. 363-370.

Gustafsson et al., "Investigations of high quality $Ge_xSi_{1-x}$ grown by heteroepitaxial lateral overgrowth using cathodoluminescence," Inst. Phys. Conf. Ser., No. 134, Section 11, Apr. 1993, pp. 675-678.

Hammerschmidt, "Intel to Use Trigate Transistors from 2009 on," EETIMES Online, available at: http://www.eetimes.com/showArticle.jhtml?articleID=189400035 (Jun. 12, 2006). 1 page.

Hasegawa, et al., "Sensing Terahertz Signals with III-V Quantum Nanostructures," Quantum Sensing: Evolution and Revolution from Past to Future, SPIE 2003, pp. 96-105.

Hayafuji et al., Japan, Journal of Applied Physics, vol. 29, 1990, pp. 2371.

Hersee et al., "The Controlled Growth of GaN Nanowires," Nano Letters, vol. 6, No. 8, 2006, pp. 1808-1811.

Hiramatsu et al., "Fabrication and characterization of low defect density GaN using facet-controlled epitaxial lateral overgrowth (FACELO)," Journal of Crystal Growth, vol. 221, Dec. 2000, pp. 316-326.

Hollander et al., "Strain and Misfit Dislocation Density in Finite Lateral Size $Si_{1-x}Ge_x$/Si Films Grown by Selective Epitaxy," Thin Solid Films, vol. 292, 1997, pp. 213-217.

Hu et al., "Growth of Well-Aligned Carbon Nanotube arrays on Silicon Substrates Using Porous Alumina Film as a Nanotemplate," 79 Applied Physics Letters 19, 2001, 3 pages.

Huang et al., "Electron and Hole Mobility Enhancement in Strained SOI by Wafer Bonding," 49 IEEE Transactions on Electron Devices 9, 2002, pp. 1566-1570.

Hydrick et al., "Chemical Mechanical Polishing of Epitaxial Germanium on $SiO_2$-patterned Si(001) Substrates," ECS Transactions, 16 (10), 2008, (pp. 237-248).

Intel Press Release, "Inters Tri-Gate Transistor to Enable Next Era in Energy-Efficient Performance," Intel Corporation (Jun. 12, 2006). 2 pages.

Intel to Develop Tri-Gate Transistors Based Processors, available at: http://news.techwhack.com/3822/tri-gate-transistors/ (Jun. 13, 2006) 6 pages.

International Preliminary Report on Patentability for International Application No. PCT/US2006/019152 dated Nov. 29, 2007, 2 pages.

International Preliminary Report on Patentability for International Application No. PCT/US2006/029247 dated Feb. 7, 2008, 12 pages.

International Preliminary Report on Patentability for International Application No. PCT/US2006/033859 dated Mar. 20, 2008, 14 pages.

International Preliminary Report on Patentability for International Application No. PCT/US2007/019568 dated Mar. 19, 2009, 10 pages.

International Preliminary Report on Patentability for International Application No. PCT/US2007/020181 dated Apr. 2, 2009, 9 pages.

International Preliminary Report on Patentability for International Application No. PCT/US2007/020777 dated Apr. 9, 2009, 12 pages.

International Preliminary Report on Patentability for International Application No. PCT/US2007/021023 dated Apr. 9, 2009, 8 pages.

International Preliminary Report on Patentability for International Application No. PCT/US2007/022392 dated Apr. 30, 2009, 14 pages.

International Search Report and Written Opinion for International Application No. PCT/US2006/019152 dated Oct. 19, 2006, 11 pages.

International Search Report and Written Opinion for International Application No. PCT/US2006/029247 dated May 7, 2007, 19 pages.

International Search Report and Written Opinion for International Application No. PCT/US2006/033859 dated Sep. 12, 2007, 22 pages.

International Search Report and Written Opinion for International Application No. PCT/US2007/007373, dated Oct. 5, 2007, 13 pages.

International Search Report and Written Opinion for International Application No. PCT/US2007/019568 dated Feb. 6, 2008, 13 pages.

International Search Report and Written Opinion for International Application No. PCT/US2007/020181 dated Jan. 25, 2008, 15 pages.

International Search Report and Written Opinion for International Application No. PCT/US2007/020777 dated Feb. 8, 2008, 18 pages.

International Search Report and Written Opinion for International Application No. PCT/US2007/021023 dated Jun. 6, 2008, 10 pages.

International Search Report and Written Opinion for International Application No. PCT/US2007/022392 dated Apr. 11, 2008, 20 pages.

International Search Report and Written Opinion for International Application No. PCT/US2008/068377, dated Jul. 6, 2009, 19 pages.

International Search Report for International Application No. PCT/US2006/019152, dated May 17, 2005. 11 pages.

International Technology Roadmap for Semiconductors—Front End Processes, pp. 1-62 (2005).

Ipri et al., "MONO/POLY technology for fabricating low-capacitance CMOS integrated circuits," Electron Devices, IEEE Transactions, vol. 35, No. 8, Aug. 1988 pp. 1382-1383.

Ishibashi, et al., "3rd Topical Workshop on Heterostructure Microelectronics for Information Systems Applications," Aug.-Sep. 1998, 115 pages.

Ishitani et al., "Facet Formation in Selective Silicon Epitaxial Growth," 24 Japan, Journal of Applied Physics, vol. 10, 1985, pp. 1267-1269.

Ismail et al., "High-quality GaAs on Sawtooth-patterned Si Substrates," 59 Applied Physics Letters 19, 1991, pp. 2418-2420.

Jain et al., "Stresses in strained GeSi stripes and quantum structures: calculation using the finite element method and determination using micro-Raman and other measurements," Thin Solid Films 292, 1997, pp. 218-226.

Jeong, et al., "Performance improvement of InP-based differential HBT VCO using the resonant tunneling diode," 2006 International Conf. on Indium Phosphide and Related Mat. Conf. Proc., pp. 42-45.

Ju et al., "Epitaxial lateral overgrowth of gallium nitride on silicon substrate," Journal of Crystal Growth, vol. 263, No. 1-4, Mar. 1, 2004, pp. 30-34.

Kamins et al., "Kinetics of Selective Epitaxial Depostion of Si1-xGex," Hewlett-Packard Company, Palo Alto, CA, Appl. Phys. Lett. 61 (6), Aug. 10, 1992 (pp. 669-671).

Kamiyama, et al., "UV laser diode with 350.9-nm-lasing wavelength grown by hetero-epitaxial-lateral overgrowth technology," Selected Topics in Quantum Electronics, IEEE Journal of Selected Topics in Quantum Electronics, vol. 11, No. 5, Sep.-Oct. 2005, pp. 1069-1073.

Kamiyama, et al., "UV light-emitting diode fabricated on hetero-ELO-grown $Al_{0.22}Ga_{0.78}N$ with low dislocation density," Physica Status Solidi A, vol. 192, No. 2, Aug. 2002, pp. 296-300.

Kawai, et al., "Epitaxial Growth of InN Films and InN Nano-Columns by RF-MBE," The Institute of Electronics, Information and Communication Engineers, Gijutsu Kenkyu, vol. 13, No. 343 (CPM2003 102-116), 2003, pp. 33-37.

(56) References Cited

OTHER PUBLICATIONS

Kazi et al., "Realization of GaAs/AlGaAs Lasers on Si Substrates Using Epitaxial Lateral Overgrowth by Metalorganic Chemical Vapor Deposition," Japan, Journal of Applied Physics, vol. 40, 2001, pp. 4903-4906.
Kidoguchi et al., "Air-bridged lateral epitaxial overgrowth of GaN thin Films," Applied Physics Letters, vol. 76, No. 25, Jun. 19, 2000, pp. 3768-3770.
Kim et al., "Silicon-Based Field-Induced Band-to-Band Tunneling Effect Transistor," IEEE Electron Device Letters, No. 25, No. 6, 2004, pp. 439-441.
Kim, et al., "GaN nano epitaxial lateral overgrowth on holographically patterned substrates," 2003 International Symposium on Compound Semiconductors, pp. 27-28.
Kimura et al., "Vibronic Fine Structure Found in the Blue Luminescence from Silicon Nanocolloids," Japan, Journal of Applied Physics, vol. 38, 1999, pp. 609-612.
Klapper, "Generation and Propagation of Dislocations During Crystal Growth," Mat. Chem. and Phys. vol. 66, 2000, pp. 101-109.
Knall et al., "Threading Dislocations in GaAs Grown with Free Sidewalls on Si mesas," Journal of Vac. Sci. Technol. B, vol. 12, No. 6, Nov./Dec. 1994, pp. 3069-3074.
Kollonitsch, et al., "Improved Structure and Performance of the GaAsSb/InP Interface in a Resonant Tunneling Diode," Journal of Crystal Growth, vol. 287, 2006, pp. 536-540.
Krishnamurthy, et al., "I-V characteristics in resonant tunneling devices: Difference Equation Method," Journal of Applied Physics, vol. 84, Issue 9, Condensed Matter: Electrical and Magnetic Properties (PACS 71-76), 1998, 9 pages.
Krost et al., "GaN-based Optoelectronics on Silicon Substrates," Materials Science & Engineering, B93, 2002, pp. 77-84.
Kusakabe, K. et al., Characterization of Overgrown GaN layers on Nano-Columns Grown by RF-Molecular Beam Epitaxy, Japan, Journal of Applied Physics, Part 2, vol. 40, No. 3A, 2001, pp. L192-194.
Kushida et al., "Epitaxial growth of $PbTiO_3$ films on $SrTiO_3$ by RF magnetron sputtering," Ultrasonics, Ferroelectrics and Frequency Control, IEEE Transactions on Ultrasonics Ferroelectrics and Frequency Control, vol. 38, No. 6, Nov. 1991, pp. 656-662.
Kwok, "Barrier-Injection Transit Time Diode," Complete Guide to Semiconductor Devices, $2^{nd}$ ed., Chapter 18, 2002, pp. 137-144.
Lammers, "Trigate and High-k stack up vs. planar," EETIMES Online, available at: http://www.eetimes.com/showArticle.jhtml?articleID=188703323&pgno=2&printable=true (Jun. 12, 2006). 2 pages.
Langdo et al., "High Quality Ge on Si by Epitaxial Necking," Applied Physics Letters, vol. 76, No. 25, Jun. 19, 2000, pp. 3700-3702.
Langdo, "Selective SiGe Nanostructures," PhD Thesis, Massachusetts Institute of Technology, Jun. 2001, 215 pages.
Lee et al., "Growth of GaN on a nanoscale periodic faceted Si substrate by metal organic vapor phase epitaxy," Compound Semiconductors: Post-Conference Proceedings, Aug. 25-27, 2003, pp. 15-21.
Lee et al., "Strain-relieved, Dislocation-free $In_xGa_{1-x}As/GaAs(001)$ Heterostructure by Nanoscale-patterned Growth," Applied Physics Letters, vol. 85, No. 18, Nov. 1, 2004, pp. 4181-4183.
Li et al., "Defect Reduction of GasAs Epitaxy on Si (001) Using Selective Aspect Ratio Trapping," 91 Applied Physics Letters, 2007, pp. 021114-1-021114-3.
Li et al., "Heteroepitaxy of High-quality Ge on Si by Nanoscale Ge seeds Grown through a Thin Layer of $SiO_2$," Applied Physics Letters, vol. 85, No. 11, Sep. 13, 2004, pp. 1928-1930.
Li et al., "Monolithic Integration of GaAs/InGaAs Lasers on Virtual Ge Substrates via Aspect-Ratio Trapping," Journal of The Electrochemical Society, vol. 156, No. 7, 2009, pp. H574-H578.
Li et al., "Morphological Evolution and Strain Relaxation of Ge Islands Grown on Chemically Oxidized Si (100) by Molecular-Beam Epitaxy," Journal of Applied Physics, vol. 98, 2005, pp. 073504-1-073504-8.
Li et al., "Selective Growth of Ge on Si (100) through Vias of $Si_{o2}$ Nanotemplate Using Solid Source Molecular Beam Epitaxy," Applied Physics Letters, vol. 83, No. 24, Dec. 15, 2003, pp. 5032-5034.
Liang et al., "Critical Thickness enhancement of Epitaxial SiGe films Grown on Small Structures," Journal of Applied Physics, vol. 97, 2005, pp. 043519-1-043519-7.
Lim et al., "Facet Evolution in Selective Epitaxial Growth of Si by cold-wall ultrahigh vacuum chemical vapor deposition," Journal of Vac. Sci. Tech., vol. B 22, No. 2, 2004, pp. 682.
Liu et al., "High Quality Single-crystal Ge on Insulator by Liquid-phase Epitaxy on Si Substrates," Applied Physics Letters, vol. 84, No. 14, Apr. 4, 2004, pp. 2563-2565.
Liu et al., "Rapid Melt Growth of Germanium Crystals with Self Aligned Microcrucibles on Si Substrates," Journal of the Electrochemical Society, vol. 152, No. 8, 2005, pp. G688-G693.
Loo et al., "Successful Selective Epitaxial $Si_{1-x}Ge_x$ Deposition Process for HBT-BiCMOS and High Mobility Heterojunction pMOS Applications," 150 Journal of Electrochemical Society 10, 2003, pp. G638-G647.
Lourdudoss et al., "Semi-insulating epitaxial layers for optoelectronic devices," Semiconducting and Insulating Materials Conference, SIMC-XL, 2000, pp. 171-178.
Luan et al., "High-quality Ge Epilayers on Si with Low Threading-dislocation Densities," Applied Physics Letters, vol. 75, No. 19, Nov. 8, 1999, pp. 2909-2911.
Luan, "Ge Photodetectors for Si Microphotonics," PhD Thesis, Massachusetts Institute of Technology, Department of Materials Science & Engineering, Jan. 12, 2001, 155 pages.
Lubnow et al., "Effect of III/V-Compound Epitaxy on Si Metal-Oxide-Semiconductor Circuits," Japan, Journal of Applied Physics, vol. 33, 1994, pp. 3628-3634.
Luo et al., Enhancement of (In,Ga)N Light-Emitting Diode Performance by Laser Liftoff and Transfer From Sapphire to Silicon, IEEE Photonics Technology Letters, vol. 14, No. 10, 2002, pp. 1400-1402.
Luryi et al., "New Approach to the High Quality Epitaxial Growth of Latticed-Mismatched Materials," Applied Physics Letters, vol. 49, No. 3, Jul. 21, 1986, pp. 140-142.
Ma, et al., "A small signal equivalent circuit model for resonant tunneling diode," Chinese Physics Letters, vol. 23, No. 8, Aug. 2006, pp. 2292-2295.
Ma, et al., "Fabrication of an AlAs/In0.53/Ga0.47/As/InAs resonant tunneling diode on InP substrate for high-speed circuit applications," 27 Chinese J. Semiconductors 6, Jun. 2006, pp. 959-962.
Maekawa, et al., "High PVCR Si/Si1—x/Gex DW RTD formed with a new triple-layer buffer," Materials Science in Semiconductor Processing, vol. 8, 2005, pp. 417-421.
Maezawa, et al., "Metamorphic resonant tunneling diodes and its application to chaos generator ICs," 44 Jap. J. Applied Physics, Part 1, No. 7A, Jul. 2005, pp. 4790-4794.
Maezawa, et al., "InP-based resonant tunneling diode/HEMT integrated circuits for ultrahigh-speed operation," IEEE Nagoya University, Institute for Advanced Research, 2006, pp. 252-257.
Martinez et al., "Characterization of GaAs Conformal Layers Grown by Hydride Vapour Phase Epitaxy on Si Substrates by Microphotoluminescence Cathodoluminescence and MicroRaman," Journal of Crystal Growth, vol. 210, 2000, pp. 198-202.
Matsunaga et al., "A New Way to Achieve Dislocation-Free Heteroepitaxial Growth by Molecular Beam Epitaxy: Vertical Microchannel Epitaxy," Journal of Crystal Growth, vol. 237-239, 2002, pp. 1460-1465.
Matthews et al., "Defects in Epitaxial Multilayers-Misfit Dislocations," Journal of Crystal Growth, vol. 27, 1974, pp. 118-125.
Monroy, et al., "High UV/visible Contrast Photodiodes Based on Epitaxial Lateral Overgrown GaN layers," Electronics Letters, vol. 35, No. 17, Aug. 19, 1999, pp. 1488-1489.
Nakano et al., "Epitaxial Lateral Overgrowth of AIN Layers on Patterned Sapphire Substrates," Source: Physica Status Solidi A, vol. 203, No. 7, May 2006, pp. 1632-1635.
Nam et al., "Lateral Epitaxy of Low Defect Density GaN Layers via Organometallic Vapor Phase Epitaxy," Applied Physics Letters, vol. 71, No. 18, Nov. 3, 1997, pp. 2638-2640.

(56) References Cited

OTHER PUBLICATIONS

Naoi et al., "Epitaxial Lateral Overgrowth of GaN on Selected-area Si (111) Substrate with Nitrided Si Mask," Journal of Crystal Growth, vol. 248, 2003, pp. 573-577.
Naritsuka et al., "InP Layer Grown on (001) Silicon Substrate by Epitaxial Lateral Overgrowth," Japan, Journal of Applied Physics, vol. 34, 1995, pp. L1432-L1435.
Naritsuka et al., "Vertical Cavity Surface Emitting Laser Fabricated on GaAs Laterally Grown on Si Substrate," Electrochemical Society Proceedings, vol. 97, No. 21, pp. 86-90.
Neudeck, et al., "Novel silicon Epitaxy for advanced MOSFET devices," Electron Devices Meeting, IEDM Technical Digest International, 2000, pp. 169-172.
Neumann et al., "Growth of III-V Resonant Tunneling Diode on Si Substrate with LP-MOVPE," Journal of Crystal Growth, vol. 248, 2003, pp. 380-383.
Ng, Kwok K., "Resonant-Tunneling Diode," Complete Guide to Semiconductor Devices, Chapter 10. Nov. 3, 2010, pp. 75-83.
Noborisaka, J., et al., "Catalyst-free growth of GaAs nanowires by selective-area metalorganic vapor-phase epitaxy," Applied Physics Letters, vol. 86, May 16, 2005, pp. 213102-1-213102-3.
Noborisaka, J., et al., "Fabrication and characterization of freestanding GaAs/AlGaAs core-shell nanowires an AlGas nanotubes by suing selective-area metalorganic vapor phase epitaxy," Applied Physics Letters, vol. 87, Aug. 24, 2005, No. 093109-1-0931093.
Noda, et al., "Current-voltage characteristics in double-barrier resonant tunneling diodes with embedded GaAs quantum rings," Physica E 32, 2006, pp. 550-553.
Norman, et al., "Characterization of MOCVD Lateral Epitaxial Overgrown III-V Semiconductor Layers on GaAs Substrates," Compound Semiconductors, Aug. 25-27, 2003, pp. 45-46.
Notification of Transmittal of the International Search Report and the Written Opinion of the International Searching Authority for PCT/US2010/029552, Applicant: Taiwan Semiconductor Manufacturing Company, Ltd., dated May 26, 2010, 14 pages.
Oehrlein et al., "Studies of the Reactive Ion Etching of SiGe Alloys," J. Vac. Sci. Tech, A9, No. 3, May/Jun. 1991, pp. 768-774.
Orihashi, et al., "Experimental and theoretical characteristics of sub-terahertz and terahertz oscillations of resonant tunneling diodes integrated with slot antennas," 44 Jap. J. Applied Physics, Part 1, No. 11, Nov. 2005, pp. 7809-7815.
Pae, et al., "Multiple Layers of Silicon-on-Insulator Islands Fabrication by Selective Epitaxial Growth," Electron Device Letters, IEEE, vol. 20, No. 5, May 1999, pp. 194-196.
Parillaud et al., "High Quality InP on Si by Conformal Growth," Applied Physics Letters, vol. 68, No. 19, May 6, 1996, pp. 2654-2656.
Park et al., "Defect Reduction and its Mechanism of Selective Ge Epitaxy in Trenches on Si(001) Substrates Using Aspect Ratio Trapping," Mat. Res. Society Symp. Proc., vol. 994, 2007, 6 pages.
Park et al., "Fabrication of Low-Defectivity, Compressively Strained Geon $Si_{0.2}G^e{}_{0.8}$ Structures Using Aspect Ratio Trapping," Journal of the Electrochemical Society, vol. 156, No. 4, 2009, pp. H249-H254.
Park et al., "Growth of Ge Thick Layers on Si (001) Substrates Using Reduced Pressure Chemical Vapor Deposition," 45 Japan, Journal of Applied Physics, vol. 11, 2006, pp. 8581-8585.
Partial International Search for International Application No. PCT/US2006/033859 dated Jun. 22, 2007, 7 pages.
Partial International Search Report for International Application No. PCT/US2008/004564 completed Jul. 22, 2009, dated Oct. 16, 2009, 5 pages.
Partial International Search Report for International Application No. PCT/US2008/068377, completed Mar. 19, 2008, dated Apr. 22, 2008, 3 pages.
PCT International Search Report of PCT/US2009/057493, from PCT/ISA/210, dated Mar. 22, 2010, Applicant: Amberwave System Corporation et al., 2 pages.
Pidin et al., "MOSFET Current Drive Optimization Using Silicon Nitride Capping Layer for 65-nm Technology Node," Symposium on VLSI Technology, Dig. Tech. Papers, 2004, pp. 54-55.
Piffault et al., "Assessment of the Strain of InP Films on Si Obtained by HVPE Conformal Growth," Indium Phosphide and Related Materials, Conference Proceedings, Sixth International Conference on Mar. 27-31, 1994, pp. 155-158.
Pribat et al., "High Quality GaAs on Si by Conformal Growth," Applied Physics Letters, vol. 60, No. 17, Apr. 27, 1992, pp. 2144-2146.
Prost, ed. "QUDOS Technical Report," 2002-2004, 77 pages.
Prost, et al., "High-speed InP-based resonant tunneling diode on silicon substrate," Proceedings of the 31st European Solid-State Device Research Conf., 2005, pp. 257-260.
Radulovic, et al., "Transient Quantum Drift-Diffusion Modelling of Resonant Tunneling Heterostructure Nanodevices," Physics of Semiconductors: $27^{th}$ International Conference on the Physics of Semiconductors—ICPS-27, Jun. 2005 AIP Conf. Proc., pp. 1485-1486.
Reed et al., "Realization of a Three-Terminal Resonant Tunneling Device: The Bipolar Quantum Resonant Tunneling Transistor," 54 Applied Physics Letters 11, 1989, p. 1034.
Ren et al., "Low-dislocation-density, Nonplanar GaN Templates for Buried Heterostructure Lasers Grown by Lateral Epitaxial Overgrowth," Applied Physics Letters, vol. 86, No. 11, Mar. 14, 2005, pp. 111901-1-3.
Rim et al., "Enhanced Hole Mobilities in Surface-Channel Strained-Si p-MOSFETs," 1995 IEDM, pp. 517-520.
Rim et al., "Fabrication and Mobility Characteristics of Ultra-thin Strained Si Directly on Insulator (SSDOI) MOSFETs," IEDM Tech. Dig., 2003, pp. 49-52.
Ringel et al., "Single-junction InGaP/GaAs Solar Cells Grown on Si Substrates with SiGe Buffer Layers," Prog. Photovolt., Res. & Applied, vol. 10, 2002, pp. 417-426.
Rosenblad et al., "A Plasma Process for Ultrafast Deposition of SiGe Graded Buffer Layers," 76 Applied Physics Letters 4, 2000, pp. 427-429.
Sakai, "Defect Structure in Selectively Grown GaN Films with Low Threading Dislocation Density," Applied Physics Letters 71, vol. 16, 1997, pp. 2259-2261.
Sakai, "Transmission Electron Microscopy of Defects in GaN Films Formed by Epitaxial Lateral Overgrowth," 73 Applied Physics Letters 4, 1998, pp. 481-483.
Sakawa et al., "Effect of Si Doping on Epitaxial Lateral Overgrowth of GaAs on GaAs-Coated Si Substrate," Japan, Journal of Applied Physics, vol. 31, 1992, pp. L359-L361.
Sass, et al., "Strain in GaP/GaAs and GaAs/GaP resonant tunneling heterostructures," Journal of Crystal Growth, vol. 248, Feb. 2003, pp. 375-379.
Schaub, et al., "Resonant-Cavity-Enhanced High-Speed Si photodiode Grown by Epitaxial Lateral Overgrowth," Photonics Technology Letters, IEEE, vol. 11, No. 12, Dec. 1999, pp. 1647-1649.
Seabaugh et al., Promise of Tunnel Diode Integrated Circuits, Tunnel Diode and CMOS/HBT Integration Workshop, Naval Research Laboratory, Dec. 9, 1999, 13 pages.
Shahidi, et al., "Fabrication of CMOS on Ultrathin SOI Obtained by Epitaxial Lateral Overgrowth and Chemical-Mechanical Polishing," Electron Devices Meeting, Technical Digest, International, Dec. 9-12, 1990, pp. 587-590.
Shichijo et al., "Co-Integration of GaAs MESFET & SI CMOS Circuits," 9 Elec. Device Letters 9, Sep. 1988, pp. 444-446.
Shubert, E.F., "Resonant tunneling diode (RTD) structures," Rensselear Polytechnic Institute, 2003, pp. 1-14.
Siekkinen, et al., "Selective Epitaxial Growth Silicon Bipolar Transistors for Material Characterization," Electron Devices, IEEE Transactions on Electron Devices, vol. 35, No. 10, Oct. 1988, pp. 1640-1644.
Su et al., "Catalytic Growth of Group III-nitride Nanowires and Nanostructures by Metalorganic Chemical Vapor Deposition," Applied Physics Letters, vol. 86, 2005, pp. 013105-1-013105-3.
Su et al., "New Planar Self-Aligned Double-Gate Fully-depleted P-MOSFETs Using Epitaxial Lateral Overgrowth (ELO) and selectively grown source/drain (S/D)," 2000 IEEE Int'l. SOI Conf., pp. 110-111.
Sudirgo et al., "Si-Based Resonant Interband Tunnel Diode/CMOS Integrated Memory Circuits," Rochester Institute of Technology, IEEE, 2006, pp. 109-112.

(56) References Cited

OTHER PUBLICATIONS

Suhara, et al, "Characterization of argon fast atom beam source and its application to the fabrication of resonant tunneling diodes," 2005 International Microprocesses and Nanotechnology Conf. Di. of Papers, 2005, pp. 132-133.

Sun et al., Electron resonant tunneling through InAs/GaAs quantum dots embedded in a Schottky diode with an AlAs insertion layer, 153 J. Electrochemical Society 153, 2006, pp. G703-G706.

Sun et al., "Room-temperature observation of electron resonant tunneling through InAs/AlAs quantum dots," 9 Electrochemical and Solid-State Letters 5, May 2006, pp. G167-G170.

Sun et al., "InGaAsP Multi-Quantum Wells at 1.5 /splmu/m Wavelength Grown on Indium Phosphide Templates on Silicon," Indium Phosphide and Related Materials, May 12-16, 2003, pp. 277-280.

Sun et al., "Selective Area Growth of InP on InP Precoated Silicon Substrate by Hydride Vapor Phase epitaxy," Indium Phosphide and Related Materials Conference, IPRM. $14^{th}$, 2002, pp. 339-342.

Sun et al., "Sulfur Doped Indium Phosphide on Silicon Substrate Grown by Epitaxial Lateral Overgrowth," Indium Phosphide and Related Materials $16^{th}$ IPRM, May 31-Jun. 4, 2004, pp. 334-337.

Sun et al., "Temporally Resolved Growth of InP in the Opening Off-Oriented from [110] Direction," Idium Phosphide and Related Materials, Conference Proceedings, 2000 International Conference, pp. 227-230.

Sun et al., "Thermal Strain in Indium Phosphide on Silicon Obtained by Epitaxial Lateral Overgrowth," 94 Journal of Applied Physics 4, 2003, pp. 2746-2748.

Suryanarayanan et al., "Microstructure of Lateral Epitaxial Overgrown InAs on (100) GaAs Substrates," Applied Physics Letters, vol. 83, No. 10, Sep. 8, 2003, pp. 1977-1979.

Suzuki, et al., "Mutual injection locking between sub-THz oscillating resonant tunneling diodes," Japan Science and Technology Agency, IEEE, Joint $30^{th}$ International Conference on Infrared and Millimeter Waves & $13^{th}$ International Conference on Terahertz Electronics, 2005, pp. 150-151.

Takasuka et al., "AlGaAs/InGaAs DFB Laser by One-Time Selective MOCVD Growth on a Grating Substrate," 43 Japan, Journal of Applied Physics, 4B, 2004, pp. 2019-2022.

Takasuka et al., "InGaAs/AlGaAs Quantum Wire DFB Buried HeteroStructure Laser Diode by One-Time Selective MOCVD on Ridge Substrate," 44 Japan, Journal of Applied Physics, 4B, 2005, pp. 2546-2548.

Tamura et al., "Heteroepitaxy on High-Quality GaAs on Si for Optical Interconnections on Si Chip," Proceedings of the SPIE, vol. 2400, 1995, pp. 128-139.

Tamura et al., "Threading Dislocations in GaAs on Pre-patterned Si and in Post-patterned GaAs on Si," Journal of Crystal Growth, vol. 147, 1995, pp. 264-273.

Tanaka et al., "Structural Characterization of GaN Lateral Overgrown on a (111) Si Substrate," Applied Physics Letters, vol. 79, No. 7, Aug. 13, 2001, pp. 955-957.

Thean et al., "Uniaxial-Biaxial Hybridization for Super-Critical Strained-Si Directly on Insulator (SC-SSOI) PMOS with Different Channel Orientations," IEEE, 2005, pp. 1-4.

Thelander, et al., "Heterostructures incorporated in one-dimensional semiconductor materials and devices," Physics of Semiconductors, vol. 171, 2002, 1 page. Abstract Only.

Thompson et al., "A Logic Nanotechnology Featuring Strained-Silicon," 25 IEEE Electron Device Letters 4, 2004, pp. 191-193.

Ting, et al., "Modeling Spin-Dependent Transport in InAS/GaSb/AlSb Resonant Tunneling Structures," 1 J. Computational Electronics, 2002, pp. 147-151

Tomiya et al., "Dislocation Related Issues in the Degradation of GaN-Based Laser Diodes," Selected Topics in Quantum Electronics, IEEE Journal of Selected Topics in Quantum Electronics, vol. 10, No. 6, Nov./Dec. 2004, pp.

Tomiya, "Dependency of crystallographic tilt and defect distribution of mask material in epitaxial lateral overgrown GaN layers," Applied Physics Letters vol. 77, No. 5, pp. 636-638.

Tran et al., "Growth and Characterization of InP on Silicon by MOCVD," Journal of Crystal Growth, vol. 121, 1992, pp. 365-372.

Tsai, et al., "InP/InGaAs resonant tunneling diode with six-route negative differential resistances," 13th European Gallium Arsenide and other Compound Semiconductors Application Symp., 2006, pp. 421-423.

Tsang et al., "The heteroepitaxial Ridge-Overgrown Distributed Feedback Laser," Quantum Electronics, IEEE Journal of Quantum Electronics, vol. 21, No. 6, Jun. 1985, pp. 519-526.

Tsaur, et al., "Low-Dislocation-Density GaAs epilayers Grown on Ge-Coated Si substrates by Means of Lateral Epitaxial Overgrowth," Applied Physics Letters, vol. 41, No. 15, Aug. 1982, pp. 347-349.

Tseng et al., "Effects of Isolation Materials on Facet Formation for Silicon Selective Epitaxial Growth," 71 Applied Physics Letters 16, 1997, pp. 2328.

Tsuji et al., Selective Epitaxial Growth of GaAs on Si with Strained Sort-period Superlattices by Molecular Beam Epitaxy under Atomic Hydrogen Irradiation, J. Vac. Sci. Technol. B, vol. 22, No. 3, May/Jun. 2004, pp. 1428-1431.

Usuda et al., "Strain Relaxation of Strained-Si Layers on SiGe-on-Insulator (SGOI) Structures After Mesa Isolation," Applied Surface Science, vol. 224, 2004, pp. 113-116.

Usui et al., "Thick GaN Epitaxial Growth with Low Dislocation Density by Hydride Vapor Phase Epitaxy," vol. 36, Japan, Journal of Applied Physics, 1997, pp. L899-L902.

Vanamu et al., "Epitaxial Growth of High-Quality Ge Films on Nanostructured Silicon Substrates," Applied Physics Letters, vol. 88, 2006, pp. 204104.1-204-104.3.

Vanamu et al., "Growth of High Quality Ge/$Si_{1-x}Ge_x$ on Nano-scale Patterned Si Structures," J. Vac. Sci. Technology. B, vol. 23, No. 4, Jul./Aug. 2005, pp. 1622-1629.

Vanamu et al., "Heteroepitaxial Growth on Microscale Patterned Silicon Structures," Journal of Crystal Growth, vol. 280, 2005, pp. 66-74.

Vanamu et al., "Improving Ge $Si_xGe_{1-x}$ Film Quality through Growth onto Patterned Silicon Substrates," Advances in Electronics Manufacturing Technology, Nov. 8, 2004, pp. 1-4.

Vescan et al., "Lateral Confinement by Low Pressure Chemical Vapor Deposition-Based Selective Epitaxial Growth of $Si_{1-x}Ge_x$/Si Nanostructures," No. 81, Journal of Applied Physics 10, 1997, pp. 6709-6715.

Vetury et al., "First Demonstration of AlGaN/GaN Heterostructure Field Effect Transistor on GaN Grown by Lateral Epitaxial Overgrowth (ELO)," Inst. Phys. Conf. Ser. No. 162: Ch. 5, Oct. 1998, pp. 177-183.

Walker, et al., "Magnetotunneling spectroscopy of ring-shaped (InGa)As quantum dots: Evidence of excited states with 2pz character," 32 Physica E 1-2, May 2006, pp. 57-60.

Wang et al, "Fabrication of Patterned Sapphire Substrate by Wet Chemical Etching for Maskless Lateral Overgrowth of GaN," Journal of Electrochemical Society, vol. 153, No. 3, Mar. 2006, pp. C182-C185.

Watanabe, et al., "Fluoride resonant tunneling diodes on Si substrates," IEEE International Semiconductor Device Research Symp. Dec. 2005, pp. 177-178.

Wernersson et al., "InAs Epitaxial Lateral Growth of W Marks," Journal of Crystal Growth, vol. 280, 2005, pp. 81-86.

Williams et al., "Etch Rates for Micromachining Processing—Part II," Journal of Microelectromechanical Systems, vol. 4, 1996, pp. 761-778.

Williams et al., "Etch Rates for Micromachining Processing—Part II," Journal of Microelectromechnical Systems, vol. 5, No. 4, Dec. 1996, pp. 256-269.

Wu et al., "Enhancement-mode InP n-channel metal-oxide-semiconductor field-effect-transistors with atomic-layer-deposited Al2O3 dielectrics," Applied Physics Letters 91, 022108-022110 (2007).

Wu et al., Gross-Sectional Scanning/Tunneling Microscopy Investigations of Cleaned III-V Heterostructures, Technical report, Dec. 1996, 7 pages.

(56) References Cited

OTHER PUBLICATIONS

Wu et al., "Inversion-type enhancement-mode InP MOSFETs with ALD Al2O3, HfAlO nanolaminates as high-k gate dielectrics," Proceedings of the 65th Device Research Conf., 2007, pp. 49-52.

Wuu et al., "Defect Reduction and Efficiency Improvement of Near-Ultraviolet Emitters via Laterally Overgrown GaN on a GaN/Patterned Sapphire Template," Applied Physics Letters, vol. 89, No. 16, Oct. 16, 2006, pp. 161105-1-3.

Xie et al., "From Porous Si to Patterned Si Substrate: Can Misfit Strain Energy in a Continuous Heteropitaxial Film Be Reduced?" Journal of Vacuum Science Technology, B, vol. 8, No. 2, Mar./Apr. 1990, pp. 227-231.

Xu et al., "Spin-Filter Devices Based on Resonant Tunneling Antisymmetrical Magnetic Semiconductor Hybrid Structures," vol. 84, Applied Physics Letters 11, 2004, pp. 1955-1957.

Yamaguchi et al., "Analysis for Dislocation Density Reduction in Selective Area Growth GaAs Films on Si Substrates," Applied Physics Letters, vol. 56, No. 1, Jan. 1, 1990, pp. 27-29.

Yamaguchi et al., "Defect Reduction Effects in GaAs on Si Substrates by Thermal Annealing," Applied Physics Letters vol. 53, No. 23, 1998, pp. 2293.

Yamaguchi et al., GaAs Solar Cells Grown on Si Substrates for Space Use: Prog. Photovolt.: Res. Appl., vol. 9, 2001; pp. 191-201.

Yamaguchi et al., "Super-High-Efficiency Multi-junction Solar Cells," Prog. Photovolt.: Res. Appl., vol. 13, 2005, pp. 125-132.

Yamamoto et al., "Optimization of InP/Si Heteroepitaxial Growth Conditions Using Organometallic Vapor Phase Epitaxy," Journal of Crystal Growth, vol. 96, 1989, pp. 369-377.

Yang et al., "High Performance CMOS Fabricated on Hybrid Substrate with Different Crystal Orientations," IEDM Tech. Dig., 2003, pp. 453-456.

Yang et al., "Selective Area Deposited Blue GaN-InGaN Multiple-quantum Well Light Emitting Diodes over Silicon Substrates," Applied Physics Letter, vol. 76, No. 3, Jan. 17, 2000, pp. 273-275.

Yanlong, et al., "Monolithically fabricated OEICs using RTD and MSM," Chinese Journal Semiconductors vol. 27, No. 4, Apr. 2006, pp. 641-645.

Yili, et al., "Physics-based hydrodynamic simulation of direct current characteristics in DBRTD," 29 Chinese J. Electron Devices 2, Jun. 2006, pp. 365-368.

Yin et al., "Ultrathin Strained-SOI by Stress Balance on Compliant Substrates and Fet Performance," 52 IEEE Trans. on Electron Devices 10, 2005, pp. 2207-2214.

Ying-Long, et al., "Resonant tunneling diodes and high electron mobility transistors integrated on GaAs substrates," Chinese Physics Letters 23, vol. 3, Mar. 2006, pp. 697-700.

Yoon et al., "Selective Growth of Ge Islands on Nanometer-scale Patterned $SiO_2$/Si Substrate by Molecular Beam Epitaxy," Applied Physics Letters, vol. 89, 2006, pp. 063107.1-063107.3.

Yoshizawa et al., "Growth of self-Organized GaN Nanostructures on Al 2O3 (0001) by RF-Radial Source Molecular Beam Epitaxy", Japan, Journal of Applied Physics, Part 2, vol. 36, No. 4B, 1997, pp. L459-L462.

Zamir et al., Thermal Microcrack Distribution Control in GaN Layers on Si Substrates by Lateral Confined Epitaxy, Applied Physics Letters, vol. 78, No. 3, Jan. 15, 2001, pp. 288-290.

Zang et al., "Nanoheteroepitaxial lateral overgrowth of GaN on nanoporous Si (111)," Applied Physics Letters, vol. 88, No. 14, Apr. 3, 2006, pp. 141925.

Zang et al., "Nanoscale lateral epitaxial overgrowth of GaN on Si (111)," Applied Physics Letters, vol. 87, No. 19 (Nov. 7, 2005) pp. 193106.1-193106.3.

Zela et al., "Single-crystalline Ge Grown Epitaxially on Oxidized and Reduced Ge/Si (100) Islands," Journal of Crystal Growth, vol. 263, 2004, pp. 90-93.

Zhang et al., "Removal of Threading Dislocations from Patterned Heteroepitaxial Semiconductors by Glide to Sidewalls," Journal of Electronic Materials, vol. 27, No. 11, 1998, pp. 1248-1253.

Zhang et al., "Strain Status of Self-Assembled InAs Quantum Dots," Applied Physics Letters, vol. 77, No. 9, Aug. 28, 2000, pp. 1295-1297.

Zheleva et al., "Lateral Epitaxy and Dislocation Density Reduction in Selectively Grown GaN Structures," Journal of Crystal Growth, vol. 222, No. 4, Feb. 4, 2001, pp. 706-718.

Zubia et al., "Initial Nanoheteroepitaxial Growth of GaAs on Si (100) by OMVPE," Journal of Electronic Materials, vol. 30, No. 7, 2001, pp. 812-816.

\* cited by examiner

LIGHT-EMITTER-BASED DEVICES WITH LATTICE-MISMATCHED SEMICONDUCTOR STRUCTURES

RELATED APPLICATION

This application is a divisional of U.S. patent application Ser. No. 11/875,381, filed Oct. 19, 2007, entitled "Light-Emitter-Based Devices with Lattice-Mismatched Semiconductor Structures," claims priority to and the benefit of U.S. Provisional Patent Application Ser. No. 60/852,781, filed on Oct. 19, 2006, the entire disclosures of these applications are hereby incorporated by reference in their entireties.

FIELD OF THE INVENTION

This invention relates generally to semiconductor processing, and particularly to formation of % light-emitting devices based on lattice-mismatched semiconductor structures.

BACKGROUND

Achieving epitaxial growth and fabrication of high-performance optoelectronic devices (i.e., III-V devices) on silicon substrates has been a goal of the semiconductor industry for decades. A major challenge has been to overcome the large lattice-mismatch and thermal-expansion differences between these two fundamentally different material systems. Various methods have been used in the past to demonstrate III-V-based lasers on Si substrates, for example utilizing very thick (~10 micrometer (μm)) epitaxial buffer layers (see "Monolithic integration of room-temperature cw GaAs/AlGaAs lasers on Si substrates via relaxed graded GeSi buffer layers," Michael B. Groenert, Christopher W. Leitz, Arthur J. Pitera, and Vicky Yang, *Journal of Applied Physics* 93 362 (2003)) or utilizing wafer bonding between a Si wafer and epitaxial layers grown on a III-V substrate (see "Electrically pumped hybrid AlGaInAs-silicon evanescent laser," Alexander W. Fang, Hyundai Park, Oded Cohen, Richard Jones, Mario J. Paniccia, and John B, Bowers, *Optics Express*, Vol 14, Issue 20, pp. 9203-9210 (2006)), However, these methods may have disadvantages from either an economic or a technical standpoint. It may be desirable to avoid both (a) thick epitaxial layers that may be time-consuming to grow, and may suffer from thermal mismatch problems, and (b) bonding between Si and III-V wafers that can suffer from poor yield, thermal mismatch problems, and a lack of commercially available III-V substrates compatible with the Si substrates used today in leading-edge manufacturing. Particularly desirable is an epitaxial solution that can (a) achieve substantial elimination of defects arising from lattice mismatch with no more than about 1 μm of growth, and (b) manage large degrees of thermal mismatch (i.e., mismatch between the thermal expansion coefficients of the substrate and the epitaxial layers).

SUMMARY

Aspect ratio trapping (ART) technology enables the formation of high-quality semiconductor materials on lattice-mismatched substrates. By properly choosing mask configurations, crystal orientations, and epitaxial growth conditions, various material defects may be trapped in a small localized area within a relatively thin epitaxial layer. Furthermore, because the ART regions are relatively small in area, thermal mismatch problems are substantially reduced, because ART islands can expand and contract elastically (producing no defects) with changes in processing temperature, instead of plastically (producing defects). ART technology greatly increases the quality of lattice-mismatched materials that may be achieved, e.g., with the growth of III-V materials on Si substrates. The straightforward process enables reliable and reproducible results.

Embodiments of the invention include the formation of a GaAS-based edge emission laser on a silicon substrate.

An aspect of the invention features a structure having, in various embodiments, a trench defined in a dielectric layer disposed over a substrate comprising a first crystalline semiconductor material. A second crystalline semiconductor material is disposed in the trench, the second crystalline semiconductor material being lattice-mismatched to the first crystalline semiconductor material. A light-emitting device is disposed over and in contact with at least a portion of the second crystalline semiconductor material.

The trench may have a height h and a width w, and a ratio of $h/w \geq 1$. The light-emitting device may be a laser or a light-emitting, diode, either of which may include GaAs, AlAs, and/or AlGaAs layers. In some embodiments, the laser or light-emitting diode may include InP, GaP. AlP, InAs, AlAs, GaAs, InSb, AlSb, GaSb, InN, and/or their ternary or quaternary compounds.

The first crystalline semiconductor material may include or consist essentially of at least one of a group IV element or compound, a II-VI compound, or a III-V compound. The second crystalline material may include a II-VI compound and/or a III-V compound.

A top contact may be disposed over at least a portion of the light-emitting, device and a second contact may be disposed over and in contact with a portion of the substrate. A plurality of trenches may be formed in the dielectric layer, with the second crystalline semiconductor material disposed in each trench. The distance between two adjacent trenches may be at feast equal to an average width of the adjacent trenches.

The light-emitting device may include a laser or a light-emitting diode (LED) epitaxial structure disposed in the trench. The second crystalline semiconductor material may extend above the dielectric layer, and the light-emitting device may comprise a laser or an LED epitaxial structure disposed above a top surface of the dielectric layer.

In another aspect, the invention features a method for forming a structure. Embodiments of the method include forming a trench having, a dielectric sidewall and a bottom surface adjacent a substrate comprising a first crystalline semiconductor material. At least a portion of the trench may be filled with a second crystalline semiconductor material lattice-mismatched to the first crystalline semiconductor material. A light-emitting device may be defined over and in contact with at least a portion of the second crystalline semiconductor material.

The trench may have a height h and a width w, and a ratio of $h/w \geq 1$. The light-emitting device may be a laser or a light-emitting diode. The trench may be filled by selective epitaxy. In an embodiment, the step for forming a trench further includes defining additional trenches, the step for filling the trench further includes forming a coalesced layer of the second crystalline semiconductor above the trenches, and the step of defining a light-emitting device forms the device over the trenches. In another embodiment, the active region of the light-emitting device may be termed within, the trench.

In another aspect, the invention features a structure having a dielectric side-wall disposed proximate a top surface of a substrate comprising a first crystalline material. A second crystalline semiconductor material is disposed proximate the dielectric side-wall, the second crystalline semiconductor material being lattice-mismatched to the first crystalline semiconductor material. A cascade superlattice may be disposed over and in contact with at least a portion of the second crystalline semiconductor material.

In another aspect, the invention features restores a method for forming a trench-based light-emitting device. Embodiments of the method include forming a trench adjacent a substrate, the trench (i) having a non-crystalline sidewall, (ii) having a width w, (iii) having a height h above a bottom surface of the trench, and (iv) having a ratio of h/w≥1, the bottom surface of the trench including, an exposed surface of the substrate. A crystalline semiconductor material may be epitaxially grows in at least a portion of the trench, the crystalline semiconductor material being lattice-mismatched to the substrate, A light-emitting device may be formal over the crystalline semiconductor material an active region of the light-emitting device being at least partially disposed within the trench.

In another aspect, the invention features a method for forming a light-emitting device using lattice-mismatched materials, and planarization. Embodiments of the method include forming an opening having a non-crystalline sidewall disposed above a surface of a substrate, the substrate comprising a first crystalline semiconductor material. A second crystalline semiconductor material may be formed in the opening, the second crystalline semiconductor material being lattice-mismatched to the first crystalline semiconductor material. A surface of the second crystalline semiconductor material may be planarized. A light-emitting device may be formed at least partially above the planarized surface of the second crystalline semiconductor material.

BRIEF DESCRIPTION OF FIGURES in the drawings, like reference characters generally refer to the same features throughout the different views. Also, the drawings are not necessarily to scale, emphasis instead being placed upon illustrating the principles of the invention.

Figure 11B:
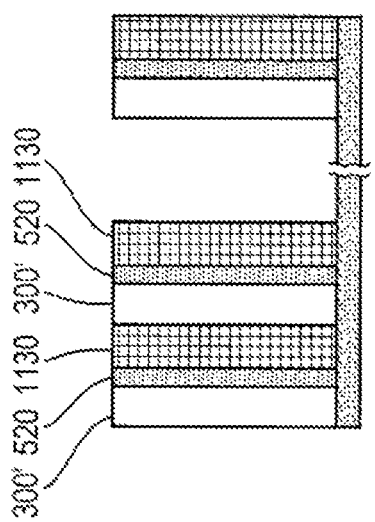
Figure 11A:
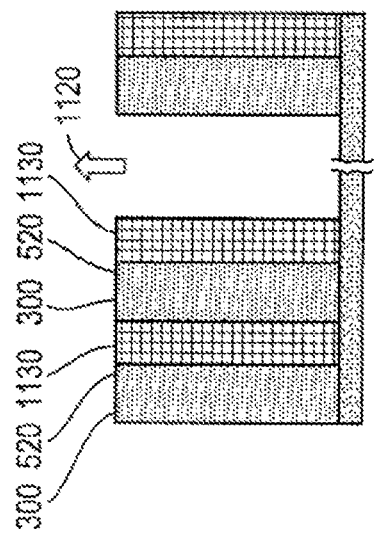

FIGS. 11a-b are plan views illustrating, one-dimensional laser diode and light-emitting diode arrays.

DETAILED DESCRIPTION

Figure 1:
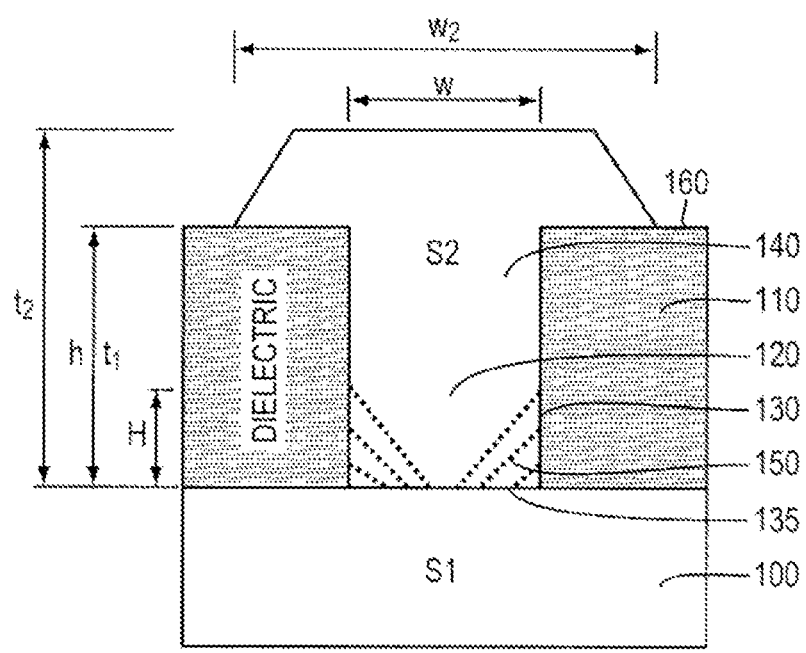
FIGS. 1-5 are schematic cross-sectional views illustrating a method for formation of a device on a semiconductor substrate in accordance with an aspect of the invention.

Referring to FIG. 1, a substrate 100 includes a first crystalline semiconductor material S1. Use substrate 100 may be, for example, a bulk silicon wafer, a bulk germanium wafer, a semiconductor-on-insulator (SOI) substrate, or a strained semiconductor-on-insulator (SSOI) substrate. The substrate 100 may include or consist essentially of the first semiconductor material S1, such as a group IV element, e.g., germanium or silicon. In an embodiment, substrate 100 includes or consists essentially of n-type (100) silicon.

A dielectric layer 110 is formed over the semiconductor substrate 100. The dielectric layer 110 may include or consist essentially of a dielectric material, such as silicon nitride or silicon dioxide. The dielectric layer 110 may be formed by any suitable technique, e.g., thermal oxidation or plasma-enhanced chemical vapor deposition (PECVD). As discussed below, the dielectric layer may have a thickness $t_1$ corresponding to a desired height h of crystalline material to be deposited in a trench formed through the dielectric layer. In some embodiments, the thickness $t_1$ of the dielectric layer 110 is in the range of 25-1000 nm. In a preferred embodiment the thickness $t_1$ is 500 nm.

A mask (not shown), such as a photoresist mask, is formed over the substrate 100 and the dielectric layer 310. The mask is patterned to expose at least a portion of the dielectric layer 110. The exposed portion of the dielectric layer 110 is removed by, e.g., reactive ion etching (RIB) to define a trench 120. Trench 120 may be defined by at least one sidewall 130, and may extend to a top surface 135 of the substrate 100. The height h of the sidewall 130 corresponds to the thickness $t_1$ of the dielectric layer 110, and may be at least equal to a predetermined distance H from a top surface 135 of the substrate. The predetermined vertical distance H is a minimum distance at which a majority of defects in a lattice-mismatched material formed in the trench terminate at the sidewall 130.

The trench may be substantially rectangular in terms of cross-sectional profile, a plan view, or both, and have a width w that is smaller than a length L (not shown) of the trench. For example, the width w of the trench may be less man about 500 nm, e.g., about 10-100 nm, and the length L of the trench may exceed each of w and H. A ratio of the height h of the trench to the width w of the trench 120 may be ≥0.5, e.g., ≥1.

A second crystalline semiconductor material S2, i.e., crystalline material 140, is formed in the trench 120. The crystalline material 140 may include or consist essentially of a group IV element or compound, a III-V compound, or a II-VI compound. Examples of suitable group IV elements or compounds include germanium, silicon germanium, and silicon carbide. Examples of suitable III-V compounds include gallium antimonide, gallium arsenide, gallium nitride, gallium phosphide, aluminum antimonide, aluminum arsenide, aluminum nitride, aluminum phosphide, indium antimonide, indium arsenide, iridium nitride, indium phosphide, and their, ternary or quaternary compounds. Examples of suitable II-VI compounds include zinc, selenide, zinc sulfide, cadmium selenide, cadmium sulfide, and their ternary or quaternary compounds.

The crystal line material 140 may be formed by selective epitaxial growth in any suitable epitaxial deposition system, including, but not limited to, metal-organic chemical vapor deposition (MOCVD), atmospheric-pressure CVD (AP-CVD), low- (or reduced-) pressure CVD (LPCVD), ultra-high-vacuum CVD (UHVCVD), molecular team epitaxy (MBE), or atomic layer deposition (ALD). In the CVD process, selective epitaxial growth typically includes introducing a source gas into the chamber. The source gas may include at least one precursor gas and a carrier gas, such as, for example, hydrogen. The reactor chamber may be healed by, for example, RF-heating. The growth temperature, in die chamber may range from about 300° C. to about 900° C., depending on the composition of the crystalline material. The growth system may also utilize low-energy plasma to enhance the layer growth kinetics.

The epitaxial growth system may be a single-wafer or multiple-wafer batch reactor. Suitable CVD systems commonly used for volume epitaxy in manufacturing applications include, for example, an Aixtron 2600 multi-wafer system available from Aixtron, based in Aächen, Germany; an EPI CENTURA single-wafer multi-chamber systems available from Applied Materials of Santa Clara, Calif.; or an EPSILON single-wafer epitaxial reactor available from ASM International based in Bilthoven. The Netherlands.

In an exemplary process, a two-step growth technique is used to form high-quality crystalline material 140, consisting essentially of GaAs, in the trench 120. First, the substrate 100 and dielectric layer 110 are thermally annealed with hydrogen at approximately 800° C. for approximately 15 minutes to desorb a thin volatile, oxide from the substrate surface 135 that may be produced timing pre-epitaxy wafer preparation. Chamber pressure during annealing may be in the range of approximately 50-100 torr, for example 75 torr. After annealing, the chamber temperature is cooled down with hydrogen flow. In order to suppress anti-phase boundaries (AFBs) on substrate surface 135, a pre-exposure to As for about 1 to 2 minutes is performed. This step helps ensure uniform coverage of the trench surface with an As—As monolayer. This pre-exposure is achieved by flowing $AsH_3$ gas through the reactor at a temperature of approximately 460° C. Then, the precursor triethylgallium (TEG) or trimethylgallium (TMG) is introduced into the chamber together with $AsH_3$ gas at a higher growth temperature, e.g., approximately 500° C. to 550° C. promote the initial GaAs nucleation process on the As pro-layer surface. This high-temperature process helps ensure that the Ga atoms are sufficiently mobile to avoid GaAs cluster formation. A slow growth rate of about 2 to 4 nm per minute with V/III ratio of about 50 may be used to obtain this initial GaAs layer, with a thickness in the range of about 50 to 100 nm.

Then a layer of n-type GaAs having a thickness of 1 to 2 µml is grown at a constant growth temperature of approximately 680° C. and a V/III ratio of approximately 80 to obtain defect-free GaAs material inside the trench 120. During this step, the GaAs epitaxial layer thickness $t_2$ may be greater than the dielectric mask thickness $t_1$. The GaAs material may have a mushroom-type cross-sectional profile with lateral over growth over the dielectric layer 110; the top portion of the GaAs material may coalesce with GaAs formed in neighboring trenches (not shown) to form an epitaxial layer. The width $w_2$ of the crystalline material 140 extending over a top surface 160 of the dielectric layer 110 may be greater than the width w of the trench 120. In this case, a small void may be formed between the laterally grows GaAs layer and the top surface 160 of the dielectric layer 110. The overall lever thickness $t_2$ of the crystalline material 140 may be monitored by using pre-calibrated growth rates and in situ monitoring equipment, according to methods routinely employed in the art.

Most, if not all dislocation defects 150 in the crystalline material 140 reach and terminate at the sidewalls of the trench 120 is the dielectric material 110 at or below the predetermined vertical distance H from the surface 135 of the substrate, such that dislocations in the crystalline material 140 decrease in density with increasing distance from the bottom portion of the trench 140. Accordingly, the upper portion of the crystalline material is substantially exhausted of dislocation detects. Various dislocation defects such, as threading dislocations, stacking faults, twin boundaries, or anti-phase boundaries may thus be substantially eliminated from the upper portion of the crystalline material.

The crystalline material 140 may be considered to have two portions: a lower portion for trapping dislocation detects and an upper portion which either (a) incorporates the laser or LED epitaxial layers or (b) serves as a template for the subsequent epitaxial growth of the laser or LED epitaxial layers. The height h of the crystalline material thus has two components: the height $h_{trapping}$ of the lower portion (where defects are concentrated) and the height $h_{upper}$ of the upper portion (which is largely free of defects). The height $h_{trapping}$ of has trapping portion may be selected from a range of about ½ w≤$h_{trapping}$≤2 w, effective trapping of dislocation defects. The actual value of required may depend upon the type of dislocation defects encountered, which may depend on the materials used, and also upon the orientation of the trench sidewalls. In some instances, the height $h_{trapping}$ can be greater than that required for effective defect trapping, in order to ensure mat the dislocation defects are trapped at a sufficient distance away from the upper portion, so that deleterious effects of dislocation defects upon device performance are not experienced. For example, $h_{trapping}$ may be, e.g., 10-100 nm greater than required for effective trapping of defects. For the upper portion, the height $h_{upper}$ may be selected from the range of approximately ½ w≤ $h_{upper}$≤10 w.

It has been observed experimentally that dislocations in a mismatched cubic semiconductor grown on a Si (100) surface in the near vicinity (e.g., within approximately 500 nm or less) of a vertical dielectric sidewall surface bend toward that surface at approximately 30 degrees through 60 degrees. For example, the dislocations may bead toward that surface at approximately a 48-degree angle to that surface. Based on this relationship, the predetermined distance H necessary to trap defects is, typically, approximately equal to a width between ½ w and 2 w, where w is the width of the trench. This range is based on the range of intersection angles of approximately 30 degrees through 60 degrees; then, tan(30°)w≤H≤tan(60°)w, which roughly corresponds to ½ w≤H≤2 w.

Figure 2:
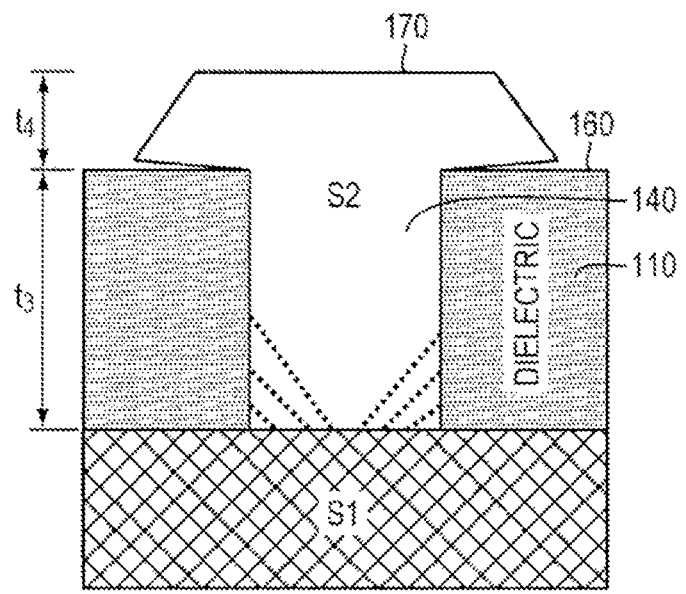

Referring to FIG. 2, a planarization step such as, e.g. chemical-mechanical polishing (CMP) may be used to planarize a lop surface 170 of the crystalline material 140 within a roughness level preferably no greater than 20 nm, to allow the formation of good quality films thereon. In an embodiment, the thickness $t_3$ of the portion of the crystalline material 140 disposed within the trench 120 is 1 µm and the thickness $t_4$ of the portion of the crystalline material 140 disposed above the top surface 160 of the dielectric layer 110 is about 0.5 µm. In another embodiment, a planarization step such as, e.g., CMP is used to planarize a top surface of the crystalline material 140 within a roughness level preferably no greater than 20 nm, to ensure that the top surface of the crystalline material 140 is substantially co-planar with the top surface 160 of the dielectric material 110.

Figure 3:
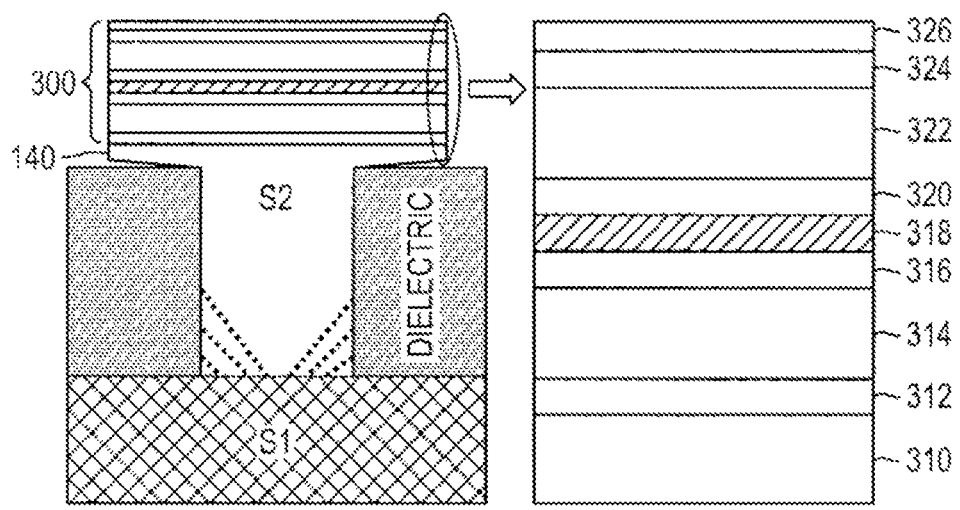

Referring to FIG. 3, a laser epitaxial structure 300 may be formed over the crystalline, material 140. For example, the laser epitaxial structure 300 may be a BaAs-based laser structure including layers of GaAs/InGaAs/AlGaAs, formed according to methods known in the art. The laser structure, described from the bottom up, may include, e.g., a ~1.5 µm thick n-GaAs base layer 310, a ~0.30 µm n-$Al_{0-0.4}$GaAs graded lower cladding layer 312, a ~1.3 µm thick n-$Al_{0.4}$GaAs cladding layer 314, an undoped ~0.3 µm $Al_{0.4-0.2}$GaAs graded lower confining layer 316, an undoped ~7 nm $In_{0.2}GaAs$ single quantum well layer 318, an undoped ~0.3 μm $Al_{0.2-0.4}GaAs$ graded upper confining layer 320, a ~1.3 μm thick p-$Al_{0.4}GaAs$ cladding layer 322, a ~0.30 μm thick p-$Al_{0.4}GaAs$ graded upper cladding 324, and a ~0.1 μm thick p$^+$-GaAs contact layer 326. These layers may be formed by epitaxial growth in any suitable epitaxial deposition system, including, but not limited to, MOCVD, APCVD, LPCVD, UHVCVD, MBE, or ALD. A growth temperature may be approximately 550~680° C. for the GaAs layer and approximately 650~800° C. for the AlGaAs layers. In an embodiment, GaAs-based laser epitaxial structures are grown on offcut Si substrates oriented about 2° off (100) towards the <011> direction in an AIXTRON 2600 MOCVD reactor at about 75 torr. TMG and trimethylaluminum (TMA) may be used as group-III sources, and arsine ($AsH_3$) may be used as the group-V source. Silane ($SiH_4$) and carbon tetrachloride ($CCl_4$) may be used as m and p-dopant sources, respectively. Hydrogen may be used as a carrier gas.

Figure 4:
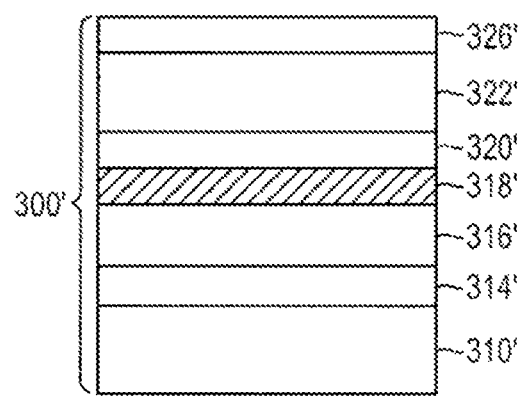

Referring to FIG. 4, instead of a laser epitaxial structure 300, an LED epitaxial structure 300' may be formed over the crystalline material 140. The surface-emitting epitaxial LED structure, includes a base layer 310', a lower cladding layer 314', an undoped lower confining layer 316', as undoped single- or multiple-quantum-well active region 318', an undoped upper confining layer 320', an upper cladding layer 322', and a heavily doped p-type contact layer 326'. Metal contacts may be formed over the p-type contact layer 326' using the process described below with reference to FIG. 5. It is often desired that light emission for LEDs be through the top surface. For this reason, a transparent top-contact material such as indium tin oxide (ITO) may be used. Alternatively, a non-transparent contact may be used, preferably not covering an entire top surface of the LED epitaxial structure.

Figure 5:
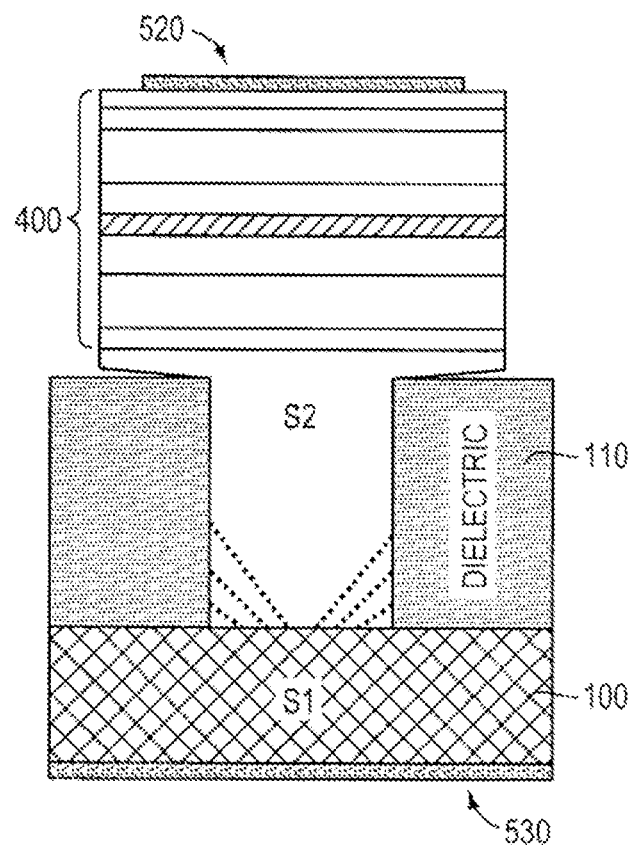
Figure 6:
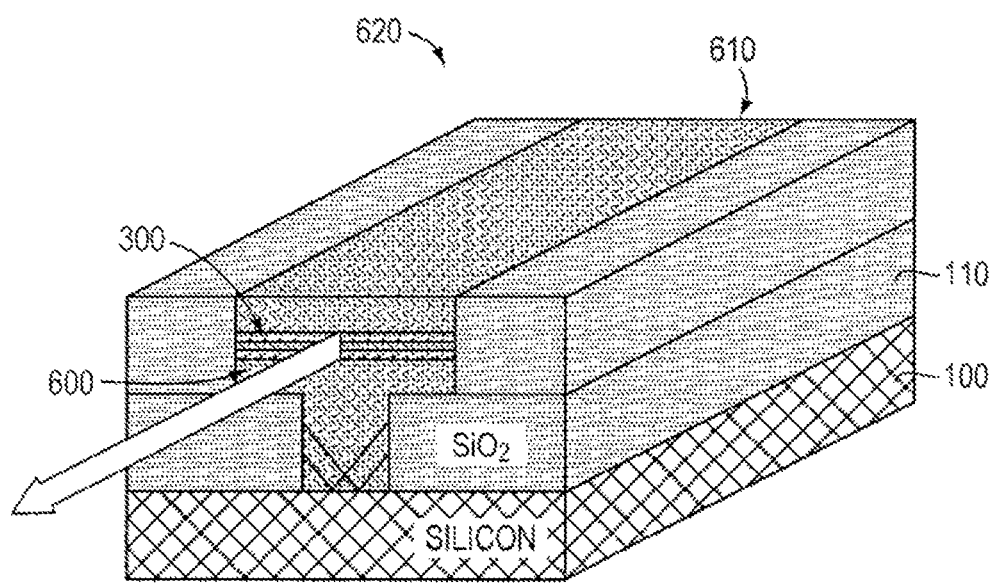
FIG. 6 is a simplified schematic perspective view of a device formed in accordance with the method illustrated in FIGS. 1-5.

Referring to FIG. 5, an RIE etch step may be performed to remove a portion of the laser epitaxial structure 300 that may extend laterally over the dielectric layer 110. This etch may remove detects that may arise from coalescence between neighboring selective epitaxial regions. Referring also to FIG. 6, at the same time, this etch may define the front and back facets 600, 610 of an edge-emission laser structure 620. The etch may be performed with, for example, argon and chlorine plasmas. A metal layer is deposited over the dielectric layer, for example via evaporation, and patterned to define a top contact 520. The metal layer may have a thickness of, e.g., approximately 150 nm. In an embodiment, the top contact 520 is a p-type contact and includes or consists essentially of Ti/Pt/Au. Following contact deposition, an anneal of approximately 350-450° C. for approximately 10 minutes may be performed to ensure good electrical contact with the laser epitaxial structure 300. A second metal contact 530, e.g., a bottom metal contact, is defined adjacent the substrate 100. A backside of the substrate 100 may be thinned before the second metal contact is defined. In an embodiment, the second metal contact is formed on the backside of the substrate. In an alternative embodiment, the second metal contact contacts the topside of the substrate through a window defined in the overlying dielectric layer(s) 110 (see FIGS. 7a-7d). The second metal contact may have a thickness of, e.g., approximately 500 nm. In some embodiments, the second metal contact is an n-type contact and includes or consists essentially of Al formed by evaporation on an n-type Si substrate. A standard laser facet coating process is used, according to methods known in the art, to obtain reflectivity of approximately 3% and approximately 95% for front and back facets, respectively. The resulting structure is a completed laser device that can be integrated into circuits formed on a semiconductor die. The laser device is a light-emitting device 620 including laser epitaxial structure 300.

A GaAs-based laser structure growth and device preparation process are illustrated in FIGS. 1-6. The figures are not to scale, and a thick laser structure is illustrated to demonstrate the general process sequence. This laser structure includes a single InGaAs quantum well centered in a waveguide, graded-index separate confinement heterostructure (GRINSCH) with 1.3-μm-thick $Al_{0.4}Ga_{0.6}As$ cladding layers. The illustrated device is designed for operation at a wavelength of 980 nm. However, the process may be utilized to form other structures based on ART technology. For instance, for small dimensional devices such as nanoscale light emitters, the full epitaxial structure for the laser may be confined inside a single trench. In this case, CMP process and laser mesa contact process, may be eliminated or simplified. Also, as discussed below, this method may be used to fabricate broad-area light emitters or emitter arrays, with large device, dimensions and covering a plurality of trenches.

Figure 7A:
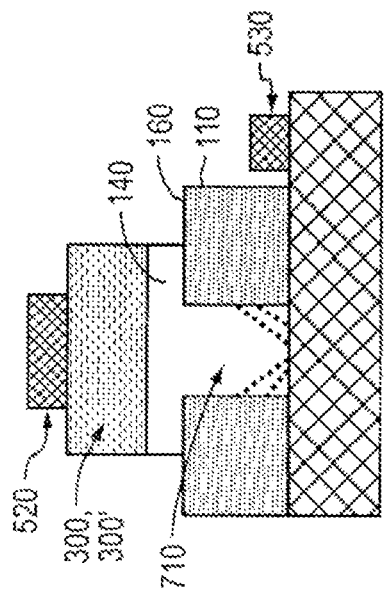
FIGS. 7a-7d are schematic cross-sectional views illustrating alternative structures formed in accordance with aspects of the invention.

Referring to FIGS. 7a-7d, the process described above with respect to FIGS. 1-6 may be used to form light-emitting structures having various configurations. Referring to FIG. 7a, laser or LED epitaxial structure 300 or 300' may be formed in trench 120. Dislocation defects 150 may be trapped within the lower trench region 710. In an embodiment, a plantation process, for example, CMP, of the crystallise material 140 is not necessary, as growth of the crystalline material 140 is halted before the crystalline material completely fills the trench 120. In this way, sufficient room (e.g., approximately 1-3 μm) is provided in m upper portion of the trench 120 for the formation of the laser or LED epitaxial structure. In some embodiments, the crystalline material 140 defines a portion of the laser or LED epitaxial, structure 300 or 300'. In other embodiments, the crystalline material 140 provides a template for the formation of the laser or LED epitaxial structure 300 or 300' in the trench 120. Top contact 520 is formed over the laser or LED epitaxial structure 300 or 300'. The second metal contact 530 contacts the topside of the substrate 100 through a window defined in the overlying dielectric layers 110 (see FIGS. 7a-7d).

Figure 7B:
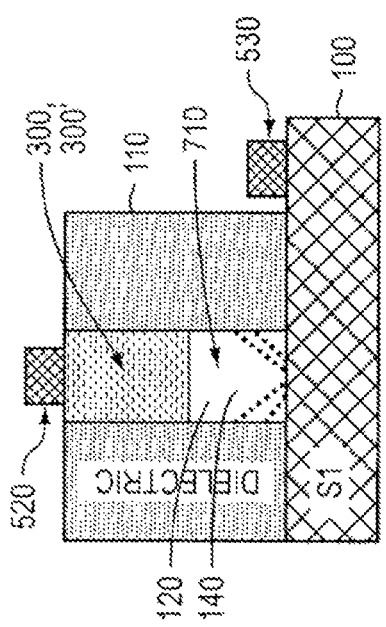

Referring to FIG. 7b, as discussed is detail with respect to FIGS. 1-6, laser or LED epitaxial structure 300 or 300' may be formed on a top portion of the crystalline material 140 extending above the top surface 160 of the dielectric layer 110.

Figure 7C:
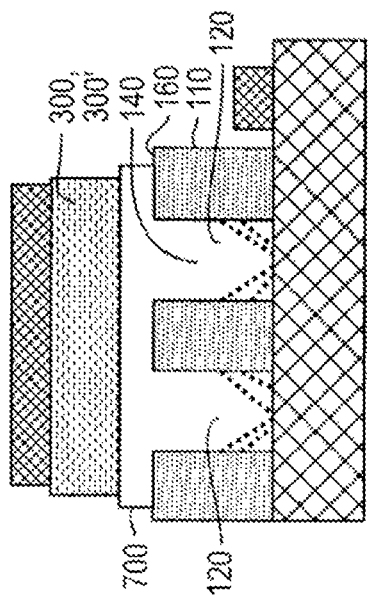

Referring to FIG. 7c, a plurality of trenches, i.e., two or more adjacent trenches may each include crystalline material 140 and a laser or LED epitaxial structure 300 or 300' disposed over the crystalline material 140 in the trench, as discussed with reference to FIG. 7a. The distance d between, two adjacent trenches may be at feast equal to the average width of the adjacent trenches. A patterned metal or a transparent top contact 520 may be formed over and in contact with each of the laser or LED epitaxial structures 300 or 300', thereby providing a broad-area laser or LED.

Figure 7D:
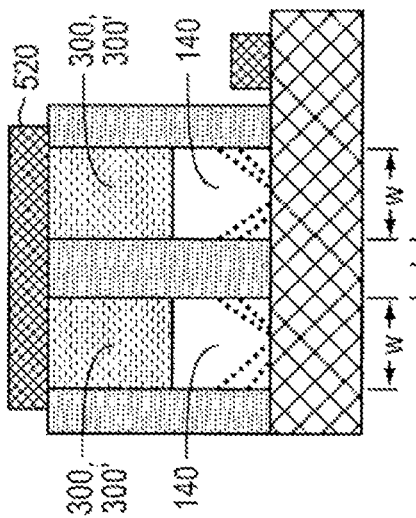

Referring to FIG. 7d, two or more adjacent trenches may each include crystalline semiconductor 140 extending above the top surface 160 of the dielectric layer 110, as described above with reference to FIGS. 1-6 and FIG. 7b. Lateral growth of the crystallise material 140 between the adjacent trenches 120 results in the coalescence of the top portions of the crystalline material into a single epitaxial film 700 of crystalline material 140. A planarization process, for example, CMP, may be perforated on a top surface of the epitaxial film 700. Thereafter, a broad area laser or LED epitaxial structure 300 or 300', containing an optical active region. Is formed over the epitaxial film 700.

Figure 8C:
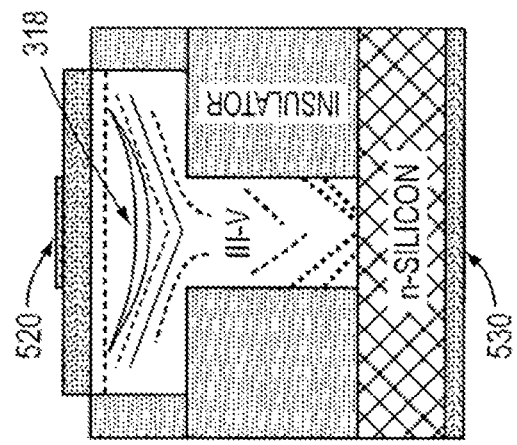
FIGS. 8a-8c are schematic cross-sectional views illustrating a method for formation of a V-groove laser diode in accordance with as aspect of the invention.
Figure 8B:
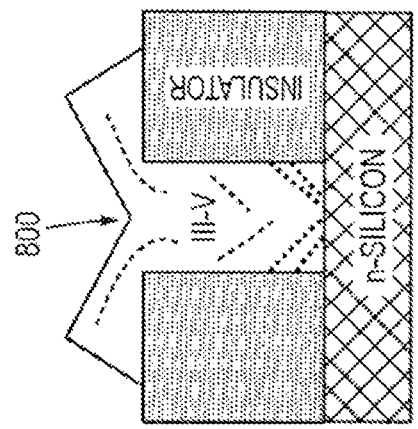
Figure 8A:
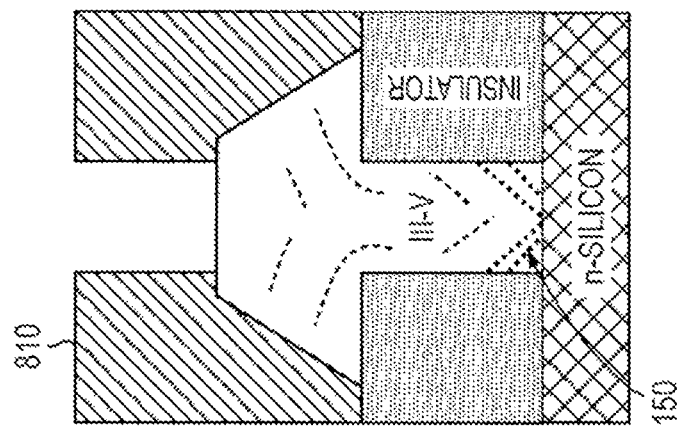

Referring to FIG. 8a-8c, the process described above with reference to FIGS. 1-6 may be combined with selective etching to form a V-groove laser diode. Referring to FIG. 8a, in an exemplary embodiment, crystalline semiconductor material 140 is formed in a trench 120, and extends beyond the top surface 160 of dielectric 110. In an embodiment, an electrically insulating diode (EID) (not shown) is added, the BID may be formed from two layers of semiconductor material, and the crystalline semi conductor material 140 may be the first of those layers. The BID may be positioned between the crystallise material 140 formed in trench 120 and the light-emitting device 300 or 300'. An n-contact 530 may be used to make an electrical connection to the crystalline material 140 above the trench 120, for example, near the top surface 160 of the dielectric layer 120; an BID may preferably then be used to prevent leakage current from the substrate 100 into the trench 120. The crystalline material 140 is preferably planarized by, for example, CMP to within a roughness; level preferably no greater than 20 nm.

Referring to FIG. 8b, the top surface of the crystal line semiconductor material 140 may then be modified with a selective etching process to create a V groove 800 in the surface of the crystalline material 140. In particular, the V groove may be formed as follows. An upper dielectric layer 810 including a dielectric, material, e.g., $Si_3N_4$, may be formed on the crystalline semiconductor material 140 using a deposition process, e.g., PECVD, and patterned by photolithography and etching. The pattern in the upper dielectric layer 910 may include stripes oriented along the trench 120 and may have dimensions similar to those of the tower dielectric layer 110. In an embodiment, the stripes defined by the upper dielectric layer have dimensions greater than those of die lower dielectric layer 110, so that die upper dielectric layer 140 covers some trenches 120 but not other trenches 120. The pattern in the upper dielectric layer may be defined by a wet etch, e.g., a buffer oxide etchant.

An appropriate wet etch, e.g., $H_2SO_4:H_2O_2:H_2O=1:8:4$, may then fee used to create a V-groove in the crystalline semiconductor material 140 exposed by the openings formed in the upper dielectric layer. The appropriate wet etch etches the crystalline semiconductor material 140 selectively with respect to the upper dielectric layer and dielectric layer 110. Moreover, the wet-etch composition is selected to define facets in the crystalline semiconductor material 140 to form the V-groove. Subsequently, the patterned upper dielectric layer may be removed.

Referring to FIG. 8c, a diode structure 300 is grown on top of the V-shaped layer to create a V-groove laser diode. This design may fee applied to the fabrication of single or trenched array laser diodes.

Figure 9A:
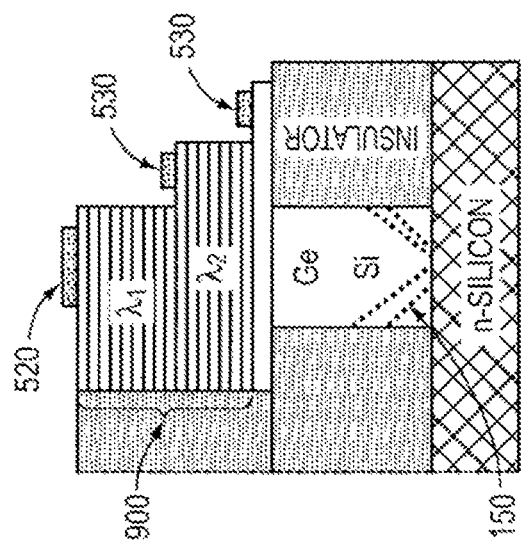
FIGS. 9a-9b are schematic cross-sectional views illustrating a method for formation of III-V cascade lasers in accordance with an aspect of the invention.
Figure 9B:
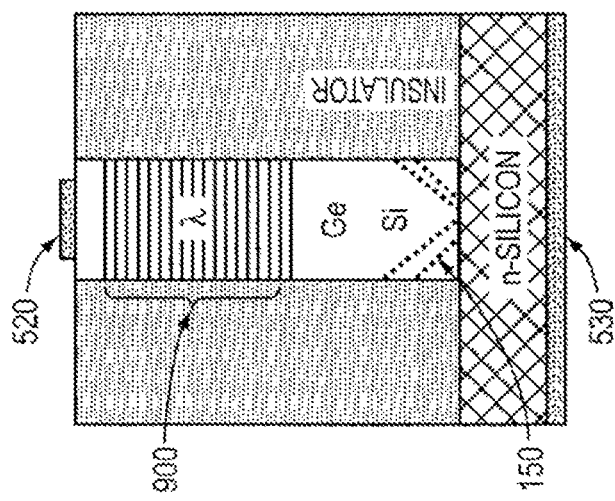

Referring to FIGS. 9a-9b, the process described above with reference to FIGS. 1-6 may be combined with the formation of cascade superlattice structures to create cascade lasers. Referring to FIG. 9a, a multiple stage cascade structure 900 may be formed with a preferred structure are design and controlled layer thicknesses, and may include, for example, InP/GaInAs/AlInAs, GaAs/AlGaAs or Si/SiGe/Si superlattice layers. The cascade structure 900 may be formed within trench 120 above dislocation defects 150. Each layer forming the cascade structure 900 may range in thickness from, for example, 1 nm to 5 nm, and may be formed with an epitaxial process, for example, MBE or MOCVD. The layers of the superlattice 900 may be formed in groups of, for example, 5-10 layers, where the composition and number of the layers within a group defines the output characteristics of the laser. Furthermore, the group of layers may be repeated, for example, 10-30 times, to increase the output power of the laser. The number of layers within a group and number of groups may be repeated as many times as the height of the crystalline semiconductor material 140 allows. Growth of the cascade structure 900 may terminated before coalesced growth occurs, to produce a near- or middle-infrared laser with peak emission at a wavelength between 3 μm and 17 μm. In some embodiments, the crystalline material 140 itself provides a template for the formation of the cascade superlattice structure 900 above the trench 120.

In the illustrated embodiment, the top contact 520 is formed over the cascade superlattice structure 900. The second metal contact 530 contacts the bottom side of the thinned substrate 100.

Referring to FIG. 9b, multiple-wavelength cascade lasers may be formed on a surface that is preferably planarized, e.g. by CMP to within a roughness level preferably no greater than 20 nm. Different wavelength emissions may be accomplished by multiple sectional etching processes. The emission wavelength is tuned over a wide range by applying a voltage using multiple-section contacts. In an embodiment, one or all of the multiple wavelength sections of the cascade superlattice structure 900 has its own n-contact 530.

Figure 10:
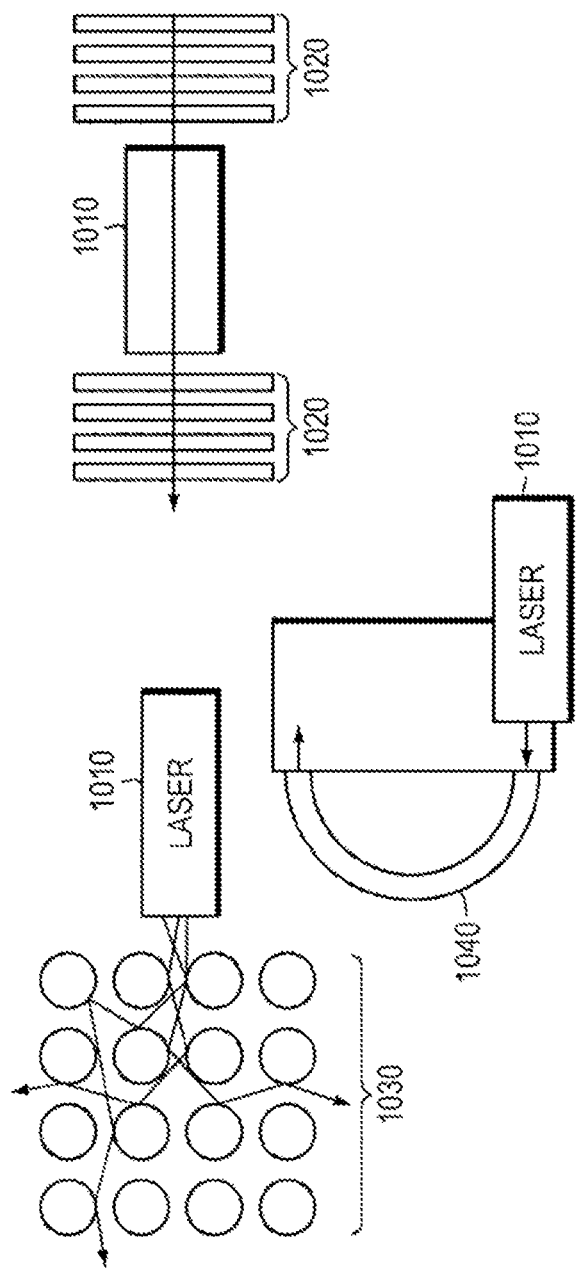
FIG. 10 is a plan view illustrating examples of photonic patterning.

Referring to FIG. 10, the process described above with respect to FIGS. 1-7 may be modified to create photonic crystals. The dielectric layer 110 may be first deposited, and then etched to produce trenches and shapes other than trenches, e.g., circular holes. These shapes correspond to features in crystalline material 140 that may be formed to direct emissions from a laser. A photonic mask layer (not shows) may fee-created to define these shapes and the dielectric layer 110 is selectively removed, e.g., etched, to form the desired shapes. After the dielectric layer 110 has been patterned, openings in the patterned dielectric layer 110 are filled with the crystalline semiconductor material 140. In an embodiment, an BID as described above is formed. The dielectric layer may then be wholly or partially removed to form an air-spaced photonic crystal array, i.e., having features separated by air. In an embodiment, part of the dielectric layer is left in place to change the refection index of the boundary between the crystalline semiconductor material 140 and the dielectric layer 110 in the photonic crystal array. In various embodiments, this crystal array is used with a laser 1010 as an optical DBR reflector 1020, beam divider 1030, or waveguide 1040, as illustrated in FIG. 10.

Referring to FIGS. 11a-b, the method described in FIGS. 1-7 may be modified to form, a number of light-emitting devices arranged in a one-dimensional array. A number of trenches of arbitrary length may be placed in close proximity to each other, and each trench may contain a light-emitting device, such as a laser diode or a light-emitting diode. Referring to FIG. 11a, a plan view of a one-dimensional array of fight-emitting diodes is shown. The p-contact 520 may cover only part of the top surface of the diode structure 300' to permit the diode to emit light perpendicular to the page from the portion of the top surface of the diode structure 300' not covered by p-contact 520. Each, diode in the array may be electrically connected by forming a layer of metal 1110 at one end of the trenches 120 that is electrically connected to each diode's p-contact 320. Neighboring diodes may be electrically isolated with a dielectric isolator structure 1130. Referring to FIG. 11b, a plan view of a one-dimensional array of laser diodes is shown. The p-contact 520 may cover the entire top surface of the laser structure 300, and the laser may output light in a direction 1120, within the plane of the page. Each laser in the one-dimensional array may be electrically connected by forming a layer of metal 1110 at one end of the trenches 120 that is electrically connected, to each laser's p-contact 520. Neighboring lasers may be electrically isolated with a dielectric isolator structure 1130.

Each light-emitting device in a one-dimensional array may be formed inside its own trench 120, as shown in FIG. 7a. In this case, each trench-defined device may be electrically isolated from a neighboring device or devices by portions of the dielectric layer 110.

In another embodiment, the light-emitting devices in the one-dimensional array are formed above the trench 120, as shown in FIG. 7b, in the single epitaxial layer resulting from the crystalline semiconductor material 140 coalescing above and between neighboring trenches. In this case, an etch step may be performed to electrically isolate the devices. This process may include the steps of (i) forming a masking layer over the light-emitting devices, (ii) removing material from the masking layer to expose portions of the crystalline semiconductor material 140 where electrical continuity is to be broken, for example, the midpoint between two trench-based light-emitting devices, and (iii) removing the exposed crystalline semiconductor material 140 with an etching process. The gags formed when the exposed crystalline semiconductor material 140 is removed may be filled with, for example, a dielectric material 1130.

The invention may be embodied in other specific forms without departing from the spirit or essential characteristics thereof. The foregoing embodiments are therefore to be considered in all respects illustrative rather than limiting on the invention described herein. Scope of the invention is thus indicated by the appended claims rather than by the foregoing description, and all changes which come within the meaning and range of equivalency of the claims are intended to be embraced therein.

What is claimed is:

1. A method comprising:
   forming a trench in a dielectric layer, the trench having dielectric sidewalls and a bottom surface adjacent a surface of a substrate comprising a first crystalline semiconductor material, the trench having a width w along and adjoining the surface of the substrate;
   filling at least a portion of the trench with a second crystalline semiconductor material lattice-mismatched to the first crystalline semiconductor material, a majority of dislocation defects in the second crystalline semiconductor material arising from the lattice-mismatch to the first crystalline semiconductor material terminating at the dielectric sidewalls;
   forming a V-shaped groove in a surface of the second crystalline semiconductor material using at least in part a wet etch process;
   forming a light-emitting device over the V-shaped groove and in contact with at least a portion of the second crystalline semiconductor material, wherein the light-emitting device has a planar surface located at a farthest point from the substrate, the planar surface having a width larger than the width w of the trench; and
   forming a dielectric material over and in contact with at least a portion of a top surface of the dielectric layer, the dielectric material further being in contact with the light-emitting device, the dielectric material having a first surface facing towards the substrate and a second surface opposite the first surface, wherein the second surface extends away from the substrate no farther than the planar surface.

2. The method of claim 1, wherein the light-emitting device is a laser diode.

3. The method of claim 1, wherein the trench is filled by selective epitaxy.

4. The method of claim 1, wherein the forming the light-emitting device comprises forming at least a portion of the light-emitting device over the portion of the top surface of the dielectric layer, and further comprising etching the light-emitting device to expose the portion of the top surface of the dielectric layer.

5. The method of claim 1 further comprising:
   forming a first conductive contact over and electrically coupled to the light-emitting device.

6. The method of claim 5 further comprising:
   forming a second contact on the substrate, the dielectric layer being present when the second contact is formed, the second contact and the trench being on opposing sides of the substrate.

7. The method of claim 5 further comprising forming a second conductive contact on the substrate, the substrate being interposed between the first conductive contact and the second conductive contact.

8. The method of claim 1, wherein the wet etch process is performed using a mixture comprising $H_2SO_4$, $H_2O_2$ and $H_2O$.

9. A method comprising:
   forming a trench adjacent a substrate, the trench being defined by non-crystalline sidewalls, the trench having a width w along a bottom surface of the trench, the bottom surface of the trench including an exposed surface of the substrate;
   epitaxially growing a crystalline semiconductor material in at least a portion of the trench, the crystalline semiconductor material being lattice-mismatched to the substrate, a majority of dislocation defects in the crystalline semiconductor material arising from the lattice-mismatch between the crystalline semiconductor material and the substrate terminating at the non-crystalline sidewalls;
   forming a V-shaped groove in a surface of the crystalline semiconductor material using at least in part a wet etch process;
   forming a light-emitting device over the crystalline semiconductor material, an active layer of the light-emitting device being disposed outside of the trench, the light-emitting device having a width greater than the width w of the trench;
   forming a first contact over the light-emitting device;
   forming a second contact on the substrate, wherein the non-crystalline sidewall is a sidewall of a dielectric material, the dielectric material being present when the second contact is formed, the second contact and the trench being on opposing sides of the substrate; and
   forming a dielectric layer over and in contact with at least a portion of a top surface of the dielectric material, the dielectric layer further being in contact with the light-emitting device, the dielectric layer extending away from the substrate no farther than a top surface of the light-emitting device.

10. The method of claim 9, wherein the light-emitting device is a laser diode.

11. The method of claim 9, wherein the trench is filled by selective epitaxy.

12. The method of claim 9, wherein forming the first contact over the light-emitting device comprises:
depositing a metal layer over the light-emitting device; and
patterning the metal layer to form the first contact.

13. The method of claim 12, wherein forming the first contact over the light-emitting device further comprises performing an anneal process.

14. The method of claim 9, further comprising, before forming the second contact on the substrate, thinning a backside of the substrate.

15. A method comprising:
forming an opening having non-crystalline sidewalls disposed above a surface of a substrate, the substrate comprising a first crystalline semiconductor material, the opening having a width w along and adjoining the surface of the substrate, the opening being in a dielectric layer;
forming a second crystalline semiconductor material in the opening, the second crystalline semiconductor material being lattice-mismatched to the first crystalline semiconductor material, a majority of dislocation defects in the second crystalline semiconductor material arising from the lattice-mismatch to the first crystalline semiconductor material terminating at the non-crystalline sidewalls, a portion of the second crystalline semiconductor material extending over a top surface of the dielectric layer, a gap being between the top surface of the dielectric layer and a bottom surface of the portion of the second crystalline semiconductor material;
planarizing a surface of the second crystalline semiconductor material;
forming a V-shaped groove in the surface of the second crystalline semiconductor material, wherein forming the V-shaped groove in the surface of the second crystalline semiconductor material comprises etching the second crystalline semiconductor material with a wet etch process;
forming a diode on the V-shaped groove;
forming a light-emitting device comprising a third crystalline semiconductor material, the third crystalline semiconductor material being formed above the second crystalline semiconductor material after forming the V-shaped groove, the light-emitting device being formed at least partially above the diode, the light-emitting device having a width greater than the width w of the opening; and
forming a dielectric material over the top surface of the dielectric layer and in physical contact with sidewalls of the light-emitting device, a top surface of the light-emitting device being exposed through the dielectric material.

16. The method of claim 15, wherein the surface of the second crystalline semiconductor material has a roughness of no greater than 20 nm.

17. The method of claim 15 further comprising:
forming a first contact over the light-emitting device; and
forming a second contact on the substrate, the second contact and the opening being on opposing sides of the substrate.

18. The method of claim 15, wherein the light-emitting device is a laser diode.

19. The method of claim 15, wherein the wet etch process is performed using a mixture comprising $H_2SO_4$, $H_2O_2$ and $H_2O$.

20. The method of claim 15, further comprising, before etching the second crystalline semiconductor material with the wet etch process, forming a dielectric mask over the second crystalline semiconductor material.

* * * * *